(12) United States Patent
Hamakawa et al.

(10) Patent No.: US 6,706,959 B2
(45) Date of Patent: Mar. 16, 2004

(54) PHOTOVOLTAIC APPARATUS AND MASS-PRODUCING APPARATUS FOR MASS-PRODUCING SPHERICAL SEMICONDUCTOR PARTICLES

(75) Inventors: Yoshihiro Hamakawa, Kawanishi (JP); Mikio Murozono, Hirakata (JP); Hideyuki Takakura, Ikeda (JP)

(73) Assignee: Clean Venture 21 Corporation, Osaka (JP)

( * ) Notice: Subject to any disclaimer, the term of this patent is extended or adjusted under 35 U.S.C. 154(b) by 0 days.

(21) Appl. No.: 09/988,998

(22) Filed: Nov. 21, 2001

(65) Prior Publication Data

US 2002/0096206 A1 Jul. 25, 2002

(30) Foreign Application Priority Data

Nov. 24, 2000 (JP) .................... P2000-358229
Mar. 30, 2001 (JP) .................... P2001-101743

(51) Int. Cl.$^7$ .................... H01L 31/0352; H01L 31/042
(52) U.S. Cl. .................... 136/250; 136/261; 136/262; 136/264; 136/265; 136/260; 136/252; 257/431; 257/464; 257/461; 438/63; 438/94; 438/95; 438/93
(58) Field of Search .................... 136/250, 261, 136/262, 264, 265, 260, 252; 257/431, 464, 461; 438/63, 94, 95, 93

(56) References Cited

U.S. PATENT DOCUMENTS 3,998,659 A * 12/1976 Wakefield .................... 136/250

| 4,188,177 A | 2/1980 | Kilby et al. |
| 4,322,379 A | 3/1982 | Kilby et al. |
| 4,407,320 A | 10/1983 | Levine |
| RE31,473 E | 12/1983 | Kilby et al. |
| 4,425,408 A | 1/1984 | Levine et al. |

(List continued on next page.)

FOREIGN PATENT DOCUMENTS

| EP | 0662722 A2 | 12/1995 |
| EP | 866506 A1 * | 9/1998 |

(List continued on next page.)

OTHER PUBLICATIONS

Russell R. Schmit et al; "Recent Progress in the Design and Fabrication of Spheral Solar Modules"; Jan. 1993; pp. 1078–1081; Conference Record of the 23$^{rd}$ IEEE Photovoltaic Specialists Conference; Dallas, Texas (USA).

*Primary Examiner*—Alan Diamond
(74) *Attorney, Agent, or Firm*—Bacon & Thomas, PLLC

(57) ABSTRACT

A photoelectric conversion element is disposed in each of a plurality of recesses of a support. Light reflected by the inside surface of the recess shines on the photoelectric conversion element. The photoelectric conversion element has an approximately spherical shape and has the following structure. The outer surface of a center-side n-type amorphous silicon (a-Si) layer is covered with a p-type amorphous SiC (a-SiC) layer having a wider optical band gap than a-Si does, whereby a pn junction is formed. A first conductor of the support is connected to the p-type a-SiC layer of the photoelectric conversion element at the bottom or its neighborhood of the recess. A second conductor, which is insulated from the first conductor by an insulator, of the support is connected to the n-type a-Si layer of the photoelectric conversion element.

17 Claims, 22 Drawing Sheets

U.S. PATENT DOCUMENTS

| | | | |
|---|---|---|---|
| 4,430,150 A | 2/1984 | Levine et al. | |
| 4,451,968 A | 6/1984 | Jensen et al. | |
| 4,521,640 A | 6/1985 | Levine | |
| 4,582,588 A | 4/1986 | Jensen et al. | |
| 4,691,076 A | 9/1987 | Levine et al. | |
| 4,806,495 A | 2/1989 | Levine et al. | |
| 5,012,619 A | 5/1991 | Knepprath et al. | |
| 5,183,493 A | 2/1993 | Brandau et al. | |
| 5,419,782 A * | 5/1995 | Levine et al. | 136/246 |
| 5,468,304 A * | 11/1995 | Hammerbacher | 136/246 |
| 6,074,476 A | 6/2000 | Hanabe et al. | |
| 6,204,545 B1 | 3/2001 | Nakata | |
| 6,221,165 B1 | 4/2001 | Zhang et al. | |
| 6,319,314 B1 | 11/2001 | Shoei | |
| 6,355,873 B1 * | 3/2002 | Ishikawa | 136/250 |
| 6,399,412 B1 * | 6/2002 | Asai et al. | 438/63 |
| 6,417,442 B1 * | 7/2002 | Fukui et al. | 136/250 |
| 6,437,234 B1 * | 8/2002 | Kyoda et al. | 136/250 |
| 6,563,041 B2 * | 5/2003 | Sugawara et al. | 136/250 |
| 2002/0162585 A1 * | 11/2002 | Sugawara et al. | 136/250 |

FOREIGN PATENT DOCUMENTS

| | | |
|---|---|---|
| JP | 58-54684 | 3/1983 |
| JP | 58-55393 | 4/1983 |
| JP | 62-126331 | 8/1987 |
| JP | 64-76909 | 3/1989 |
| JP | 4-227043 | 8/1992 |
| JP | 6-13633 | 1/1994 |
| JP | 6-212212 | 8/1994 |
| JP | 7-54855 | 6/1995 |
| JP | 7-202244 | 8/1995 |
| JP | 7-297438 | 11/1995 |
| JP | 8-239298 | 9/1996 |
| JP | 9462434 | 6/1997 |
| JP | 10-33969 | 2/1998 |
| JP | 11-12091 | 1/1999 |
| JP | 11-31837 | 2/1999 |
| JP | 2000-22184 | 1/2000 |
| JP | 2000-169279 | 6/2000 |
| JP | 2000-328111 | 11/2000 |
| JP | 2001-102618 | 4/2001 |
| JP | 2001-339086 | 12/2001 |
| JP | 2002-050780 | 2/2002 |
| JP | 2002-134766 | 5/2002 |
| WO | WO98/15983 | 4/1998 |

* cited by examiner

SHAPES AND CRYSTALLINITY CONTROL

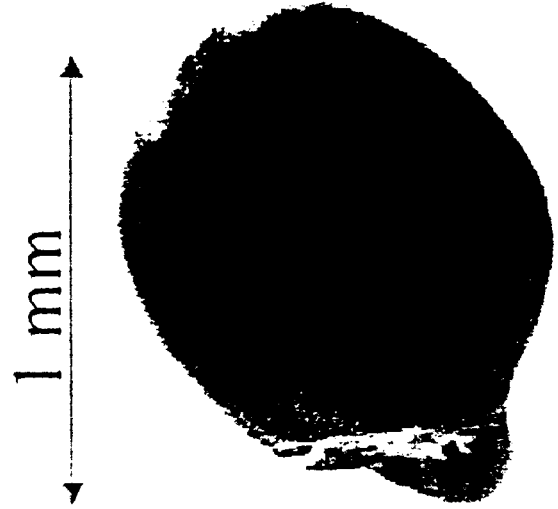
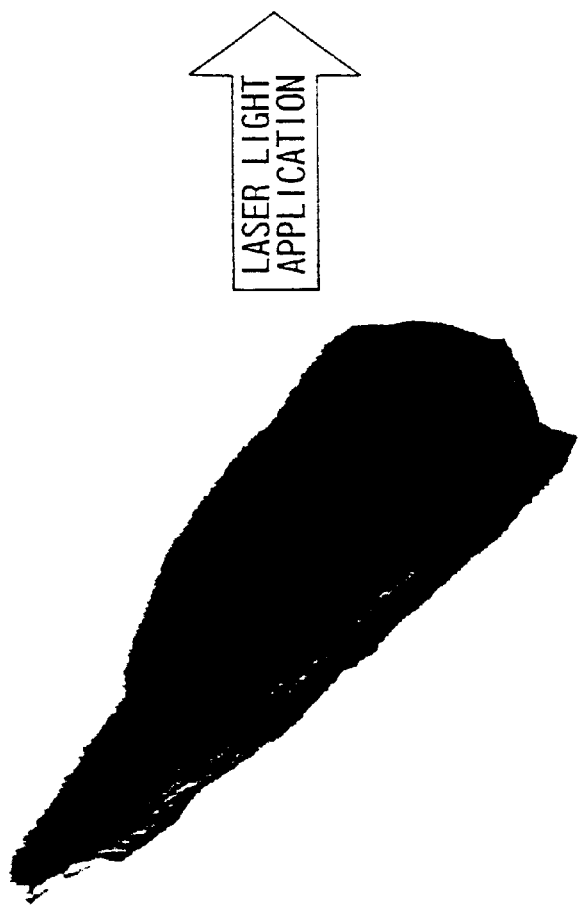

PHOTOVOLTAIC APPARATUS AND MASS-PRODUCING APPARATUS FOR MASS-PRODUCING SPHERICAL SEMICONDUCTOR PARTICLES

BACKGROUND OF THE INVENTION

1. Field of the Invention

The present invention relates to a photovoltaic apparatus and to a mass-producing apparatus for mass-producing spherical semiconductor particles, suitable for manufacture of photovoltaic apparatus and the like.

In the disclosure herein described, the term "pin junction" is to be construed as including a structure that n-, I- and p-type semiconductor layers are formed on an approximately spherical photoelectric conversion element so as to be arranged in this order outward from the inside of the approximately spherical photoelectric conversion element or inward from the outside.

2. Description of the Related Art

A typical related art technique provides a photovoltaic apparatus comprising a photoelectric conversion element composed of a crystal silicon semiconductor wafer. The related art photovoltaic apparatus is of cost expenditure because the step for producing a crystal is complex. Furthermore, the step for manufacturing a semiconductor wafer is not only complex because it includes cutting of a bulk single crystal, slicing, and polishing, but also the step is wasteful because crystal waste produced by the cutting, slicing, polishing etc. amounts to about 50% by volume or more of the original bulk single crystal.

Another related art technique provides a photovoltaic apparatus comprising a photoelectric conversion element composed of an amorphous silicon (abbreviated as "a-Si") thin film, which solves the above-mentioned problems. Since a thin-film photoelectric conversion layer is formed by the plasma CVD (chemical vapor deposition) method, this related art photovoltaic apparatus has advantages that the steps which are conventionally required, such as cutting of a bulk single crystal, slicing, and polishing, are not necessary and that a deposited film can be used in its entirety as device active layers. The amorphous silicon photovoltaic apparatus, however, has a drawback that the semiconductor has a number of crystal defects (i.e., gap states) inside the semiconductor due to the amorphous structure, the amorphous silicon solar battery has a problem that the photoelectric conversion efficiency decreases due to a photo-induced deterioration phenomenon. To solve this problem, conventionally, a technique of inactivating crystal defects by applying hydrogenation treatment has been developed, whereby the manufacture of such electronic devices as an amorphous silicon solar battery has been realized.

Even such a treatment, however, cannot entirely eliminate the adverse effects of crystal defects, and for example, the amorphous silicon solar battery still has a weak point that the photoelectric conversion efficiency decreases by 15% to 25%.

A recently developed technique for suppressing the photo-induced deterioration has realized a stack-type solar battery in which a photoelectrically active i-type layer is made extremely thin and 2-junction or 3-junction solar cells are used, and has succeeded in suppressing the photo-induced deterioration to about 10%. It has become apparent that the degree of photo-induced deterioration decreases when the operation temperature of solar cells is high. Although a module technique in which solar cells are caused to operate in such a condition is now being developed, it does not satisfy all the requirements and further improvements are required.

Still another related art technique in which the above problem is eliminated is disclosed in Japanese Examined Patent Publication JP-B27-54855 (1995). According to this related art technique, a solar array is formed in the following manner. Spherical particles each having a p-type silicon sphere and an n-type silicon skin are buried in a flat sheet of aluminum foil having holes. The internal p-type silicon spheres are exposed by etching away the n-type silicon skins from the back side of the aluminum foil. The exposed-type silicon spheres are connected to another sheet of aluminum foil.

In this related art technique, to reduce the costs by decreasing the used amount of high-purity silicon, it is necessary to decrease the average thickness of the entire device by decreasing the outer diameter of the particles. To increase the conversion efficiency, it is necessary to enlarge the light-receiving surface, and to this end, it is necessary to arrange the particles closer to each other. In summary, a number of particles having a small outer diameter need to be arranged densely and connected to the sheets of aluminum foil. This makes complex the step of connecting the particles to the sheets of aluminum foil, with the result that a sufficient cost reduction is not achieved.

Such spherical semiconductor particles are required in order to manufacture a solar array such as one disclosed in JP-B2 7-54855. In such a solar array, photoelectromotive force generated by applying light to silicon spherical semiconductor particles can be obtained by electrically connecting the silicon spherical semiconductor particles to the metal foil matrix.

As disclosed in U.S. Pat. No. 5,012,619, for example, such spherical particles are manufactured in such a manner that a solid-state material is crushed into particles having irregular outer shapes, resulting particles are put in a cylinder that is provided with a lining for grinding, and a gas eddy flow is formed in the cylinder to thereby collide the particles with the lining or with each other.

This related art technique requires much time and labor to manufacture spherical semiconductor particles and hence is inferior in cost reduction aspect.

Yet another related art technique is disclosed in Japanese Unexamined Patent Publication JP-A 8-239298 (1996). In this related art technique, a thin silicon rod is manufactured in the following manner. A tip portion of a silicon rod that is vertically held is melted by high-frequency heating. After a seed silicon crystal is fusion-bonded to the molten silicon rod, the seed silicon crystal and the silicon rod are moved away from each other in the vertical direction, whereby a thin silicon rod that is less than 1 mm in thickness is obtained. According to this prior art technique, a thin silicon rod is manufactured at a rate of 5 mm/min to 10 mm/min, for example. It is desired that a large number of spherical semiconductor particles be manufactured at much higher rate.

SUMMARY OF THE INVENTION

An object of the present invention is to provide a highly reliable, highly efficient photovoltaic apparatus that can be mass-produced easily while the used amount of semiconductor material such as high-purity silicon is decreased, that is, a highly reliable, high-efficiency photovoltaic apparatus that can be manufactured at low costs with smaller amounts of consumption of resources and energy.

Another object of the invention is to provide an apparatus capable of mass-producing spherical semiconductor particles easily by simple manipulations.

A first aspect of the invention provides a photovoltaic apparatus comprising:

(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and (b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portions of the first semiconductor layers.

According to the invention, the approximately spherical photoelectric conversion elements are disposed in the respective recesses of the support and the inside surfaces of the respective recesses are constituted by the first conductor or the coating formed on the first conductor. Therefore, external light such as sunlight is directly applied to each of the photoelectric conversion elements as well as after being reflected by the part of the first conductor or coating formed on the first conductor which is the inside surface of the recess.

Since the photoelectric conversion elements are disposed in the respective recesses, intervals are formed in between, that is, their arrangement is not dense. However, the number of photoelectric conversion elements used is decreased, with the result that the used amount of high-purity material (e.g., silicon) of the photoelectric conversion elements can be reduced and the step of connecting the photoelectric conversion elements to the conductors of the support can be made easier.

Further, the recesses are arranged adjacent to each other, whereby external light is reflected by the inside surfaces of the recesses and then applied to the photoelectric conversion elements. Therefore, external light can be efficiently used for generation of photoelectromotive force by the photoelectric conversion elements. Accordingly it is achieved to maximize the electric power generation amount per unit area opposed to a light source of the photoelectric conversion elements.

The photoelectric conversion elements may be made of a single-crystal, polycrystalline, or amorphous material and may be made of a silicon material, a compound semiconductor material, or the like. The photoelectric conversion elements may have a pn structure, a pin structure, a Schottky barrier structure, a MIS (metal-insulator-semiconductor) structure, a homojunction structure, a heterojunction structure, or the like.

The inside first semiconductor layer is partially exposed through the opening of the outside second semiconductor layer, which makes it possible to take out photoelectromotive force that is generated between the first and second semiconductor layers during application of light. The second semiconductor layers of the respective photoelectric conversion elements disposed in the respective recesses of the support are electrically connected to the first conductor of the support. The exposed portions of the inside first semiconductor layers of the respective photoelectric conversion elements are electrically connected to the second conductor which is formed on the first conductor with the insulator interposed in between. In a structure in which the first conductor and the second conductor extend to form a plane, the photoelectric conversion elements are connected to each other in parallel with the first and second conductors and can produce a large current.

The photoelectric conversion element may either be a complete sphere or have an outer surface that is approximately a complete spherical surface. The first semiconductor layer may be solid and have an approximately spherical shape. Alternatively, the first semiconductor layer may be formed on the outer surface of a core that is prepared in advance. As a further alternative, the approximately spherical first semiconductor layer may have a hollow central portion.

In the invention it is preferable that the photoelectric conversion elements have an outer diameter of 0.5 mm to 2.0 mm.

According to the invention, the photoelectric conversion elements may have an outer diameter of 0.5 mm to 2.0 mm, preferably of 0.8 to 1.2 mm, more preferably of about 1.0 mm. This makes it possible to sufficiently reduce the used amount of material such as high-purity silicon and to maximize the electric power generation amount. Further, the spherical photoelectric conversion elements can be handled easily during manufacture and the productivity can be increased.

In the invention it is preferable that the opening of the second semiconductor layer has a central angle θ1 of 45° to 90°.

By setting the central angle θ1 at 45° to 90°, preferably at 60° to 90°, the amounts of those parts of the first and second semiconductor layers which are discarded to form the opening can be reduced, that is, the loss of material can be reduced. Further, setting the central angle θ1 in such a range allows the opening to have a sufficient area for the electrical connection between the first semiconductor layer and the second conductor of the support.

In the invention it is preferable that the recesses of the support have respective openings of a polygon (e.g., honeycomb polygon) of which ones adjacent to each other are continuous, that each of the recesses narrows toward a bottom thereof, and the first semiconductor layer and second semiconductor layer of each of the photoelectric conversion elements are electrically connected to the second conductor and the first conductor, respectively, at the bottom or in a vicinity thereof of the recess.

In the invention it is preferable that the first conductor is provided with a circular first connection hole formed at the bottom or in a vicinity thereof of the recess and the insulator is provided with a circular second connection hole having a common axial line with the first connection hole, that a portion of the photoelectric conversion element in a vicinity of the opening of the second semiconductor layer fits in the first connection hole and an outer surface portion above the opening of the second semiconductor layer is electrically connected to an end face of the first connection hole of the first conductor or to a portion thereof in the vicinity of the end face, and that the exposed portion of the first semiconductor layer of the photoelectric conversion element is electrically connected to the second conductor through the second connection hole.

In the invention it is preferable that an outer diameter D1 of the photoelectric conversion elements, an inner diameter D2 of the openings of the second semiconductor layers, and an inner diameter D3 of the first connection holes, and an inner diameter D4 of the second connection holes satisfy a relationship D1>D3>D2>D4.

According to the invention, a portion of the photoelectric conversion element in the vicinity of the opening fits in the first connection hole of the first conductor and the exposed portion of the first semiconductor layer of the photoelectric conversion element is electrically connected to the second conductor through the second connection hole of the insulator of the support, the first conductor and the second conductor of the support can easily be connected electrically to the second semiconductor layer and the first semiconductor layer, respectively, of the photoelectric conversion element.

As for the electrical connection between the second semiconductor layer and the first conductor, a portion, above the opening, of the outer surface of the second semiconductor layer is electrically connected to the end face of the first connection hole and/or a portion of the first conductor in the vicinity of the end face, that is, the inner circumferential face of the first connection hole and/or a portion of the first conductor in the vicinity of and surrounding the first connection hole (see FIG. 1).

For example, each projection of the second conductor formed by elastic deformation may be inserted through the second connection hole and electrically connected to the portion of the first semiconductor layer that is exposed through the opening. Alternatively, the portion of the first semiconductor layer that is exposed through the opening may be connected to the second conductor with conductive paste provided in the second connection hole or via a conductive bump such as a metal bump.

Setting the outer diameter D1 and the inner diameters D2–D4 so as to satisfy the above inequality enables reliable electrical connection without causing undesired short-circuiting.

In the invention it is preferable that a light-gathering ratio x which equals to S1/S2 is selected to be in a range of 2 to 8, wherein S1 is an opening area of each of the recesses of the support and S2 is an area of a cross-section of the photoelectric conversion elements including a center thereof.

A second aspect of the invention provides a photovoltaic apparatus comprising:
 (a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
 (b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portions of the first semiconductor layers,
 wherein each of the photoelectric conversion elements has an outer diameter of 0.5 mm to 2 mm, and a light-gathering ratio x which equals to S1/S2 is selected to be in a range of 2 to 8, wherein S1 is an opening area of each of the recesses of the support and S2 is an area of a cross-section of the photoelectric conversion elements including a center thereof.

A third aspect of the invention provides a photovoltaic apparatus comprising:
 (a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
 (b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portions of the first semiconductor layers, wherein each of the photoelectric conversion elements has an outer diameter of 0.8 mm to 1.2 mm, and a light-gathering ratio x which equals to S1/S2 is selected to be in a range of 4 to 6, wherein S1 is an opening area of each of the recesses of the support and S2 is an area of a cross-section of the photoelectric conversion elements including a center thereof.

For example, the openings of the respective recesses of the support assume honeycomb polygons such as hexagon. Each recess narrows toward its bottom, and a photoelectric conversion element is disposed at the bottom of each recess. Each photoelectric conversion element is electrically connected to the conductors of the support at the bottom or its neighborhood of the recess. Since the openings of the respective recesses assume polygons and are continuous with each other, all the light received by all the surface of the support opposed to a light source (e.g., sunlight) excluding the areas of the photoelectric conversion elements can be applied to the photoelectric conversion elements. Therefore, what is called a light-gathering-type photoelectric conversion element can be realized in which the light-gathering ratio x=S1/S2 is set at 2 to 8, for example (preferably 4 to 6). This makes it possible to increase the intervals between the photoelectric conversion elements, decrease the number of photoelectric conversion elements, and simplify the step of electrically connecting the photoelectric conversion elements to the support. Therefore, the used amount of high-purity semiconductor as a material of the photoelectric conversion elements can be reduced and the invention can be practiced inexpensively. Having a relatively simple structure, the support is superior in productivity and can be manufactured easily.

An experiment conducted by the present inventor shows that when a photovoltaic apparatus according to the invention in which the approximately spherical silicon photoelectric conversion elements have an outer diameter of 800 μm to 1,000 μm and the light-gathering ratio x is set at 4–6 is converted into an imaginary flat plate that uses the same weight of silicon as the silicon that constitutes all the photoelectric conversion elements of the photovoltaic apparatus and that has the same area as the area of a projection of the photovoltaic apparatus onto a plane perpendicular to light coming from a light source, the imaginary flat plate has a thickness of about 90 μm to 120 μm. This means that the amount of silicon that is used for generating an electric power of 1 W is as small as 2 g, which is an epoch-making conclusion. In the above-described first prior art technique using photoelectric conversion elements formed on a single-crystal silicon semiconductor wafer, the silicon single crystal is as thick as 350 μm to 500 μm and the thickness amounts to about 1 mm when the slice loss is included. Therefore, in the first prior art technique, the amount of silicon that is used for generating an electric power of 1 W is about 15 to 20 g. It is understood that the invention can make the used amount of silicon much smaller than in the first prior art technique.

When the light-gathering ratio x is set larger than 8, the number of necessary photoelectric conversion elements can be decreased and the amount of silicon used for generating an electric power of 1 W could further be reduced. However, in practice, as the light-gathering ratio x increases, the light-gathering efficiency which is the ratio of optical energy absorbed by the photoelectric conversion elements to that incident on the recesses becomes smaller and the performance of the photovoltaic apparatus lowers accordingly.

By setting, as described above, the outer diameter of each photoelectric conversion element at 0.5 mm to 2.0 mm (preferably 0.8 mm to 1.2 mm) and setting the light-gathering ratio x at 2 to 8 (preferably 4 to 6), the number of photoelectric conversion elements can be decreased, the amount of silicon used for generating an electric power of 1 W can be reduced, and the step of electrically connecting the photoelectric conversion elements to the support can further be simplified. As such, the combination of the values of the outer diameter of each photoelectric conversion element and the light gathering ratio x is important in decreasing the number of photoelectric conversion elements and reducing the amount of silicon used for generating an electric power of 1 W.

When the outer diameter of each photoelectric conversion element is smaller than 0.5 mm, the number of necessary photoelectric conversion elements becomes unduly large though the used amount of silicon decreases. When the outer diameter of each photoelectric conversion element is greater than 2 mm, the used amount of silicon becomes unduly large though the number of necessary photoelectric conversion elements decreases.

When the light-gathering ratio is smaller than 2, the used amount of silicon cannot be reduced sufficiently. When the light-gathering ratio is greater than 8, the light-gathering efficiency becomes smaller than 80%, for example, and the performance lowers accordingly. By setting the light-gathering ratio x in the proper range, the invention makes it possible to make the light-gathering efficiency greater than 80% or even 90%.

According to the invention, by setting the values of the outer diameter of each photoelectric conversion element and the light-gathering ratio x in the above-mentioned ranges, such a remarkable advantage is achieved that both of the number of necessary photoelectric conversion elements and the amount of silicon to be used for generating an electric power of 1 W can greatly be decreased to ⅕ to ¹⁄₁₀ of those in the third prior art technique.

In a photovoltaic apparatus in which amorphous silicon photoelectric conversion elements are used and light is gathered at a light-gathering ratio in the above-mentioned range, the temperature of the photoelectric conversion elements can be increased to 40° C. to 80° C., which is higher than in the case of using an amorphous silicon, thin-plate photoelectric conversion element. This makes it possible to suppress deterioration of the amorphous silicon photoelectric conversion element and to thereby elongate the life of the photovoltaic apparatus.

In the invention it is preferable that the photoelectric conversion elements have a pn junction in such a manner that the second semiconductor layer of one conductivity type having a wider optical band gap than the first semiconductor layer having the other conductivity type does is formed outside the first semiconductor layer (see FIG. 14).

In the invention it is preferable that the photoelectric conversion elements have a pin junction in such a manner that the first semiconductor layer having one conductivity type, an amorphous intrinsic semiconductor layer, and an amorphous second semiconductor layer of the other conductivity type having a wider optical band gap than the first semiconductor layer does are arranged outward in this order (see FIGS. 15 and 16).

In the invention it is preferable that the first semiconductor layer and the second semiconductor layer are made of n-type silicon and p-type amorphous SiC, respectively.

In the invention it is preferable that the n-type silicon of which the first semiconductor layer is made is n-type single-crystal silicon or n-type microcrystalline (μc) silicon.

According to the invention, a pn or pin heterojunction window structure is formed by different kinds of amorphous semiconductors. The optical band gap of the second semiconductor layer located on the light incidence side and made of a window material is set wider than that of the inside first semiconductor layer. With this measure, the optical absorption coefficient of the second semiconductor layer is made small, that is, light is not much absorbed by the second semiconductor layer, whereby the electron-hole recombination rate of the surface layer is decreased and the optical absorption loss is reduced. Further, the sensitivity on the shorter-wavelength side is increased to attain wide gap window action. The energy conversion efficiency can be increased as a result of those effects.

In particular, the pin junction structure can introduce much optical energy to the intrinsic semiconductor layer (i layer) as a photoelectromotive force generating layer and increase the sensitivity in the shorter-wavelength side to attain wide gap window action. The invention makes it possible to perform a far better energy converting operation than the particle according to the third prior art technique does in which the n-type silicon skin is formed outside the p-type silicon sphere.

The i layer of a photoelectric conversion element having a pin junction plays roles of forming electron-hole pairs through light absorption there, generating a photocurrent, and transporting it. The p layer and the n layer play a role of collecting photocarriers by fixing the Fermi level at a position close to the valence band or the conduction band and generating an internal electric field for carrying electrons and holes generated in the i layer to the two electrodes.

A fourth aspect of the invention provides a spherical semiconductor particles mass-producing apparatus comprising a crucible for storing a semiconductor; heating means for heating and melting the semiconductor in the crucible; a nozzle for dropping a molten semiconductor coming from the crucible; and vibrating means for vibrating the molten semiconductor and thereby converting, in a vapor phase, the dropping molten semiconductor into spherical particles having uniform particle diameters.

According to the invention, a semiconductor is stored in the crucible and melted by the heating means. A resulting molten semiconductor is dropped from the nozzle and vibrated by the vibrating means. As a result, the molten semiconductor dropping from the nozzle is converted into spherical particles in a vapor phase. The spherical particles have approximately a constant diameter. In this manner, spherical semiconductor particles can easily be mass-produced by a simple operation. The term "vapor phase" may be air or an inert gas of Ar, $N_2$, or the like, and even encompasses the vacuum.

A molten semiconductor dropping from the nozzle is in liquid form rather than solid line form. Therefore, a large number of spherical semiconductor particles can easily be manufactured at high speed and hence in a short time. For example, the invention makes it possible to manufacture spherical semiconductor particles by dropping a molten semiconductor from the nozzle at a rate of 1 cm/s to 1 m/s, which is much higher than in the above-described prior art technique.

In the invention it is preferable that the mass-producing apparatus further comprises means for pressuring the molten semiconductor in the crucible.

In the invention it is preferable that the pressurizing means is a gas source for supplying an inert gas having a pressure higher than atmospheric pressure to a space over the semiconductor in the crucible.

In the invention it is preferable that a pressure of a space with which an outlet of the nozzle communicates is selected to be lower than that of a space over the semiconductor in the crucible does.

In the invention it is preferable that a plurality of the nozzles are provided and each of the nozzles has an inner diameter of 1±0.5 mm and a length of 1 mm to 100 mm.

In the invention it is preferable that each of the nozzles has a length of 5 mm to 10 mm.

According to the invention, a molten semiconductor in the crucible may be pressurized by means of a gas or a liquid or by using a piston or the like. The pressurized molten semiconductor drops from the crucible. For example, to pressurize a molten semiconductor by means of a gas, an inert gas of Ar, $N_2$, or the like having a pressure higher than atmospheric pressure is supplied from a gas source to the space over the semiconductor in the crucible. Alternatively, the pressure of the space under the outlet of the nozzle may be set lower than the pressure of the space over the semiconductor in the crucible so that a molten semiconductor coming from the crucible drops from the nozzle. Setting the nozzle inner diameter and length at 1±0.5 mm and 1 mm to 100 mm (preferably 5 mm to 10 mm), respectively, can cause a molten semiconductor to drop from the nozzle at a constant flow rate, for example, by means of the pressure of the pressuring means without dropping at an unduly high flow rate because of its own weight. This makes it possible to accurately produce spherical particles having uniform particle diameters.

In the invention it is preferable that the heating means comprises an induction heating coil provided in the vicinity of the crucible and a high-frequency power source for energizing the induction heating coil.

In the invention it is preferable that the heating means is resistive heating means for heating the crucible.

That is, the heating means for heating a semiconductor in the crucible may have a configuration for induction heating including an induction heating coil and a high-frequency power source, or may be resistive heating means such as an electric heater that heats the crucible by Joule heat.

In the invention it is preferable that the vibrating means has a vibration frequency of 10 Hz to 1 kHz.

With this setting, a molten semiconductor is converted into spherical semiconductor particles having uniform particle diameters, which enables mass-production of spherical semiconductor particles.

In the invention it is preferable that the vibrating means applies sound waves or ultrasonic waves to the dropping molten semiconductor and thereby vibrate the dropping molten semiconductor.

According to the invention, applying sound waves or ultrasonic waves to a dropping molten semiconductor makes it possible to accurately convert the dropping molten semiconductor into spherical particles having uniform particle diameters.

In the invention it is preferable that the nozzle is vibratory, and the vibrating means vibrates the nozzle by reciprocating.

In the invention it is preferable that the vibrating means drives the nozzle so that an outlet of the nozzle vibrates in a direction perpendicular to the axial line of the nozzle at an amplitude A that is smaller than ½ of an outer diameter D1 of particles to be formed.

In the invention it is preferable that the vibrating means vibrates the nozzle along the axial line of the nozzle.

According to the invention, the nozzle is vibrated so as to reciprocate at least in the vicinity of its outlet, which makes it possible to accurately produce spherical semiconductor particles having uniform particle diameters. Vibrating the outlet of the nozzle in the direction perpendicular to its axial line at the amplitude A that is smaller than ½ of the outer diameter D1 of particles to be formed so as to have uniform particle diameters (i.e., A<D½) makes it possible to accurately produce spherical particles having the outer diameter D1. Alternatively, the nozzle may be vibrated along its axial line, that is, in the vertical direction. This also makes it possible to produce spherical particles having uniform diameters (D1).

In the invention it is preferable that the vibrating means is pressure varying means for varying a pressure of a space over the semiconductor in the crucible.

In the invention it is preferable that the vibrating means comprises a diaphragm provided so as to communicate with the space over the semiconductor in the crucible, and a driving source for reciprocating the diaphragm.

In the invention it is preferable that the vibrating means comprises a driving chamber that is connected to the space over the semiconductor in the crucible, and a driving source for oscillating a pressure inside the driving chamber.

According to the invention, the vibrating means for vibrating a molten semiconductor is pressure varying means for varying the pressure of the space over the molten semiconductor in the crucible by applying gas pressure to the space. The pressure varying means may be implemented by a diaphragm and a driving source (e.g., a motor and a crank) for reciprocating the diaphragm, or by a driving chamber and a driving source for varying the capacity of the driving chamber and thereby oscillating the pressure inside the driving chamber.

In the invention it is preferable that the vibrating means vibrates the crucible.

According to the invention, to vibrate a molten semiconductor, the crucible in which the molten semiconductor is stored temporarily may be vibrated by a driving source.

In the invention it is preferable that the mass-producing apparatus further comprises Lorentz force generating means for exerting Lorentz force on the molten semiconductor dropping from the nozzle and thereby forming particles through a pinch effect of decreasing a cross-section of the molten semiconductor.

According to the invention, a current is caused to flow through a conductive molten semiconductor dropping from the nozzle and an AC magnetic field is developed around the molten semiconductor, whereby Lorentz force is exerted on the liquid column molten semiconductor and a resulting pinch effect decreases its cross-section. This makes it possible to accurately convert a molten semiconductor dropping from the nozzle into spherical particles having uniform diameters.

A fifth aspect of the invention provides a spherical semiconductor particles mass-producing apparatus comprising a crucible for storing a semiconductor temporarily; heating means for heating and melting the semiconductor in the crucible; a nozzle for dropping a molten semiconductor coming from the crucible; vibrating means for vibrating the molten semiconductor and thereby converting, in a vapor phase, the dropping molten semiconductor into spherical particles having uniform particle diameters; and crystallizing means for heating liquid or solid particles dropping from the nozzle in the vapor phase to control a cooling rate thereof and thereby converting the particles into single-crystal or polycrystalline particles.

A sixth aspect of the invention provides a spherical semiconductor particles mass-producing apparatus comprising crystallizing means for heating liquid or solid particles existing in a vapor phase and thereby converting the particles into single-crystal or polycrystalline particles.

According to the invention, liquid or solid particles dropping from the nozzle is heated and re-melted by the crystallizing means, whereby the particles are converted into single-crystal or polycrystalline particles in the vapor phase.

Particles to be heated may be molten (i.e., liquid) semiconductor particles or solid particles formed by cooling of molten semiconductor particles dropping from the nozzle, or even particles obtained by pulverizing or crushing a bulk semiconductor.

In the invention it is preferable that the crystallizing means is a laser source for applying laser light to the particles.

In the invention it is preferable that the crystallizing means is a radiation heat source provided adjacent to a passage of the particles, for heating the particles by radiation heat.

In the invention it is preferable that the crystallizing means heats the particles so that the cooling rate of the particles has a gentle profile, to thereby prevent development of cracks in the particles and prevent the particles from becoming amorphous.

According to the invention, the crystallizing means may be a laser source or a radiation heat source for generating radiation heat. The temperature decrease rate of particles when they are cooled is lowered by the crystallizing means, whereby development of cracks in the particles is prevented and the particles are prevented from becoming amorphous. As a result, single-crystal or polycrystalline spherical particles are formed reliably.

A seventh aspect of the invention provides a spherical semiconductor particles mass-producing apparatus comprising a crucible for storing a semiconductor temporarily; heating means for heating and melting the semiconductor in the crucible; a nozzle for dropping a molten semiconductor coming from the crucible; vibrating means for vibrating the molten semiconductor and thereby converting, in a vapor phase, the dropping molten semiconductor into spherical particles having uniform particle diameters; crystallizing means for heating liquid or solid particles dropping from the nozzle in the vapor phase to control a cooling rate thereof and thereby converting the particles into single-crystal or polycrystalline particles; and diffusing means for causing crystalline semiconductor particles of one conductivity type to pass through a passage in a material gas containing atoms or molecules with which the crystalline semiconductor particles are to be doped, and thereby forming a surface layer of the other conductivity type on each of the crystalline semiconductor particles.

The invention provides a spherical semiconductor particles mass-producing apparatus in which crystalline semiconductor particles of one conductivity type are passed through a passage in a material gas containing atoms or molecules with which the crystalline semiconductor particles are to be doped, to form a surface layer of the other conductivity type on each of the crystalline semiconductor particles.

According to the invention, each of crystalline semiconductor particles of one conductivity type (e.g., p-type) can be formed with a surface layer of the other conductivity type (e.g., n-type) by a simple operation according to a gas diffusion method or a solid-state diffusion method. The gas diffusion method is a technique that a doping impurity is sent, in gas form, to a high-temperature silicon surface. The solid-state diffusion method is a technique that a diffusion agent containing an impurity is deposited on a silicon surface and then the silicon is heat-treated at a high temperature.

In the invention it is preferable that the passage extends in a vertical direction and surface layer diffusion is performed as the crystalline semiconductor particles drop through the passage.

An exemplary case of forming a diffusion layer on a surface of each silicon sphere by the diffusion method is to forma shallow n-type diffusion layer in each of p-type silicon spheres by the gas diffusion method will be described below. A gas of $P_2O_5$, $POCl_3$, $PH_3$, or the like is used as a diffusion source. First, an inert gas containing the diffusion source and a slight amount of hydrogen is introduced to a diffusion layer forming space that is adjacent to from the laser light application space and is separated from the latter in terms of atmosphere, and the diffusion layer forming space is filled with the inert gas. After being re-crystallized with high quality by illumination with laser light, p-type silicon spheres pass through the diffusion layer forming space from its top portion to its bottom portion while being kept at a high temperature. As the p-type silicon spheres pass through the diffusion layer forming space, each of them is formed, over the entire surface, with an n-type diffusion layer at a depth that is necessary for each silicon sphere to function as a solar cell. This step can be executed continuously so as to produce a large number of silicon spheres each formed with a surface layer by introducing the inert gas continuously and properly controlling the gas atmosphere of the diffusion layer forming space.

In the invention it is preferable that the crystalline semiconductor particles on which a diffusion agent is deposited bypassing through the passage are heated to form thereon a surface layer having a desired thickness.

According to the invention, p-type silicon spheres, for example, are caused pass through the diffusion layer forming space from its top portion to its bottom portion and, during that course, each of them is formed, over the entire surface, with a shallow n-type diffusion layer. Then, a number of resulting silicon spheres are put on a container made of quartz or the like and again subjected to a heat treatment. As a result, n-type diffusion layers having a desired thickness are formed.

In the invention it is preferable that the semiconductor is silicon.

According to the invention, the invention may be practiced for another semiconductor.

An eighth aspect of the invention provides a photoelectric conversion element comprising a plurality of semiconductor layers formed by the above-described mass-producing apparatus.

A ninth aspect of the invention provides a photovoltaic apparatus comprising a plurality of photoelectric conversion elements described above.

A tenth aspect of the invention provides a spherical semiconductor particles mass-producing method comprising the steps of heating and melting a semiconductor; dropping a molten semiconductor in a vapor phase; and vibrating the molten semiconductor.

An eleventh aspect of the invention provides a spherical semiconductor particles mass-producing method comprising the step of heating and re-melting, in a vapor phase, dropping semiconductor particles and thereby converting the semiconductor particles into single-crystal or polycrystalline semiconductor particles.

In the invention it is preferable that the mass-producing method further comprises the step of performing diffusion in a gas containing a composition with which the single-crystal or polycrystalline semiconductor particles are to be doped.

According to the invention, it is made possible to easily manufacture a photovoltaic apparatus using those photoelectric conversion elements composed of spherical semiconductor particles. The photovoltaic apparatus using such spherical photoelectric conversion elements is the first to generate a high electric power per unit area opposed to a light source using as small an amount of single-crystal or polycrystalline semiconductor material as possible. The photoelectric conversion elements may be made of not only a single-crystal or polycrystalline material but also an amorphous material.

According to the invention, the photoelectric conversion efficiency can be increased by introducing a microcrystalline ($\mu c$) semiconductor layer, which has high conductivity, between the first semiconductor layer and a pin junction layer. An amorphous pin junction layer or a heterojunction of an amorphous pin junction layer and the second semiconductor layer can enable efficient collection of photocarriers and reduce the recombination loss of photocarriers.

The temperature of the amorphous semiconductor is increased to 40° C. to 80° C. when receiving light that is reflected by the inside surface of the recess of the support. This suppresses deterioration of the photoelectric conversion characteristic and hence is advantageous. Since each photoelectric conversion element has an approximately spherical shape, increase of the incident optical energy per unit area for receiving direct light or reflection light is suppressed, which also suppresses deterioration of the photoelectric conversion characteristic.

In the invention it is preferable that the first semiconductor layer is a direct gap semiconductor layer.

In the invention it is preferable that the direct gap semiconductor layer is made of a semiconductor selected from the group consisting of InAs, GaSb, CuInSe$_2$, Cu(InGa)Se$_2$, CuInS, GaAs, InGaP, and CdTe.

According to the invention, employing, as the inside first semiconductor layer, a direct gap semiconductor which easily absorbs light makes it possible to obtain sufficiently high electron and hole transition probabilities, which also contributes to increase of the photoelectric conversion efficiency.

In the invention it is preferable that a plurality of the supports each having peripheral portions extending outward are arranged adjacent to each other, and that part of the first conductor in the peripheral portion of one support of each pair of supports adjacent to each other and part of the second conductor in the peripheral portion of the other are laid one on another and electrically connected to each other.

In the invention it is preferable that the peripheral portion has upward projections or downward projections, and that the upward projection or downward projection of one support of each pair of supports adjacent to each other and the upward projection or downward projection of the other are brought into contact with and electrically connected to each other.

According to the invention, where part of the first conductor in a peripheral portion of one support of each pair of supports adjacent to each other among a plurality of supports mounted with photoelectric conversion elements and part of the second conductor in a peripheral portion of the other are laid one on another and electrically connected to each other, photoelectromotive forces, generated by the photoelectric conversion elements, of the respective supports are connected to each other in series. This makes it possible to output a desired high voltage.

According to the invention, where an upward projection and a downward projection, upward projections, or downward projections of peripheral portions of each pair of supports adjacent to each other are electrically connected to each other (see FIGS. 12 and 13), the recesses of each support can be made closer to each other and as many recesses and photoelectric conversion elements as possible can be arranged in a limited area.

The invention makes it possible to greatly reduce the used amount of photoelectric conversion element material (in particular, expensive silicon) and to simplify the step of connecting the photoelectric conversion elements to the support by decreasing the number of photoelectric conversion elements, to thereby increase the productivity and reduce the cost. In particular, the use of the photoelectric conversion elements according to the invention makes it possible to realize a manufacturing method capable of saving resources and energy. Sunlight or the like is reflected by the surface of the first conductor or a coating formed thereon that constitutes the inside surface of each recess of the support and resulting reflection light shines on the photoelectric conversion element. In this manner, incident light can be utilized effectively. The first conductor or a coating formed thereon serves to not only reflect incident light but also guide currents (the first conductor is connected to the second semiconductor layers of the respective photoelectric conversion elements). Having a simple structure, the support is superior in productivity.

In particular, by setting the outer diameter of each photoelectric conversion element at 0.5 mm to 2.0 mm (preferably 0.8 mm to 1.2 mm) and the light-gathering ratio x at 2 to 8 (preferably 4 to 6), the invention provides a remarkable advantage that both of the amount of silicon to be used for generating an electric power of 1 W and the number of necessary photoelectric conversion elements can greatly be decreased to $1/5$ to $1/10$ of those in the third prior art technique. Reducing the used amount of silicon makes it possible to realize a photovoltaic apparatus at a low cost. Decreasing the number of photoelectric conversion elements and thereby simplifying the step of electrically connecting the photoelectric conversion elements to the support increase the productivity, which also contributes to realization of a low-cost photovoltaic apparatus.

Therefore, the invention makes it possible to provide a highly reliable, highly efficient photovoltaic apparatus.

A pn or pin junction is formed by setting the optical band gap of the outside amorphous second semiconductor layer wider than that of the center-side first semiconductor layer. With this measure, light is not much absorbed by the light-incidence-side second semiconductor layer made of a window material, whereby the recombination rate of the surface layer is decreased and wide gap window action is attained. The energy conversion efficiency can be increased as a result of those effects.

Inserting a microcrystalline ($\mu c$) semiconductor layer having high conductivity between the center-side first semiconductor layer and the outside pin junction layer makes it possible to increase the energy conversion efficiency.

The invention also makes it possible to increase the energy conversion efficiency by using a direct gap first semiconductor layer.

Further, the invention facilitates manufacture of photoelectric conversion elements.

The invention makes it possible to mass-produce spherical semiconductor particles having uniform particle diameters by a simple operation by dropping, from the nozzle, a semiconductor that has been melted in the crucible and vibrating the molten semiconductor. Particles thus produced can easily be converted into single-crystal or polycrystalline particles in a vapor phase. And each crystalline semiconductor particle can easily be formed with a surface layer though impurity doping.

BRIEF DESCRIPTION OF THE DRAWINGS

Other and further objects, features, and advantages of the invention will be more explicit from the following detailed description taken with reference to the drawings wherein:

FIGS. 23A and 23B are sectional views of a semiconductor particle according to another embodiment of the invention;

DETAILED DESCRIPTION OF THE PREFERRED EMBODIMENTS

Figure 1:
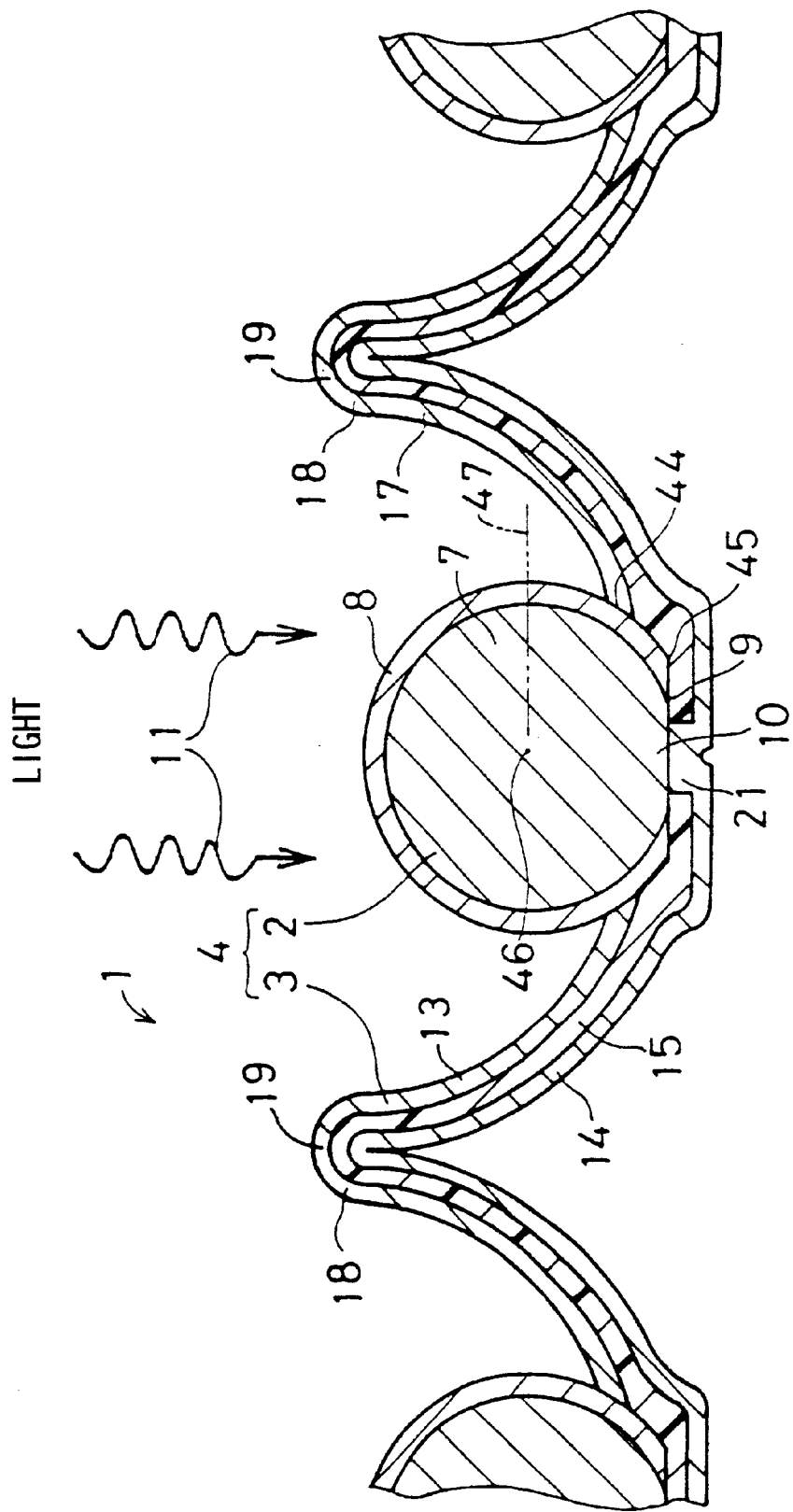
FIG. 1 is an enlarged sectional view of part of a photovoltaic apparatus 1 according to an embodiment of the present invention.

Now referring to the drawings, preferred embodiments of the invention are described below.

Figure 2:
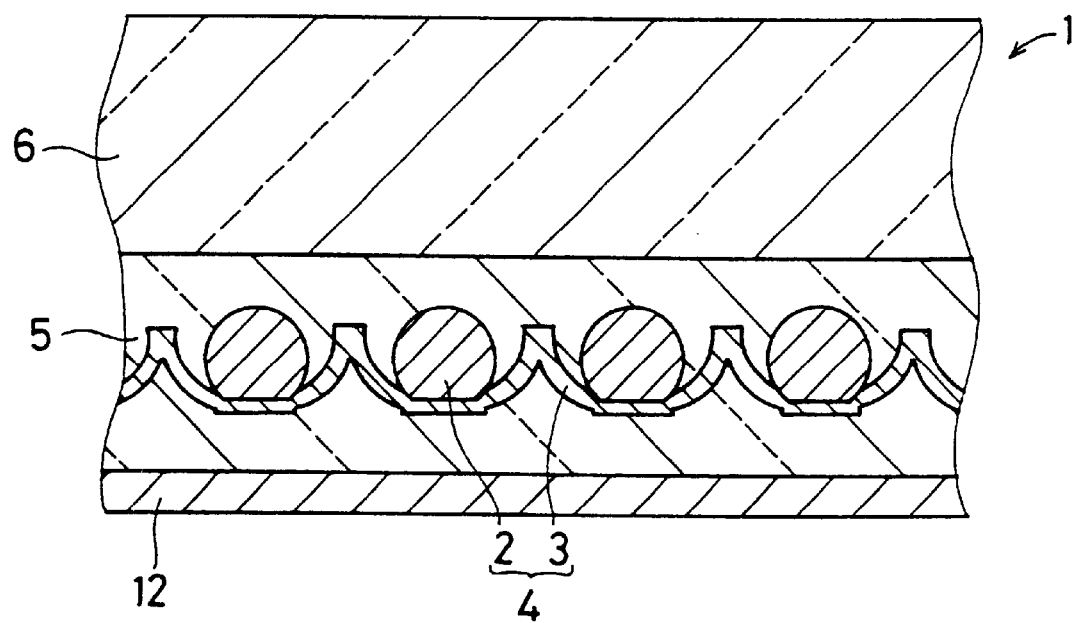
FIG. 2 is a sectional view showing the structure of the photovoltaic apparatus 1.
Figure 3:
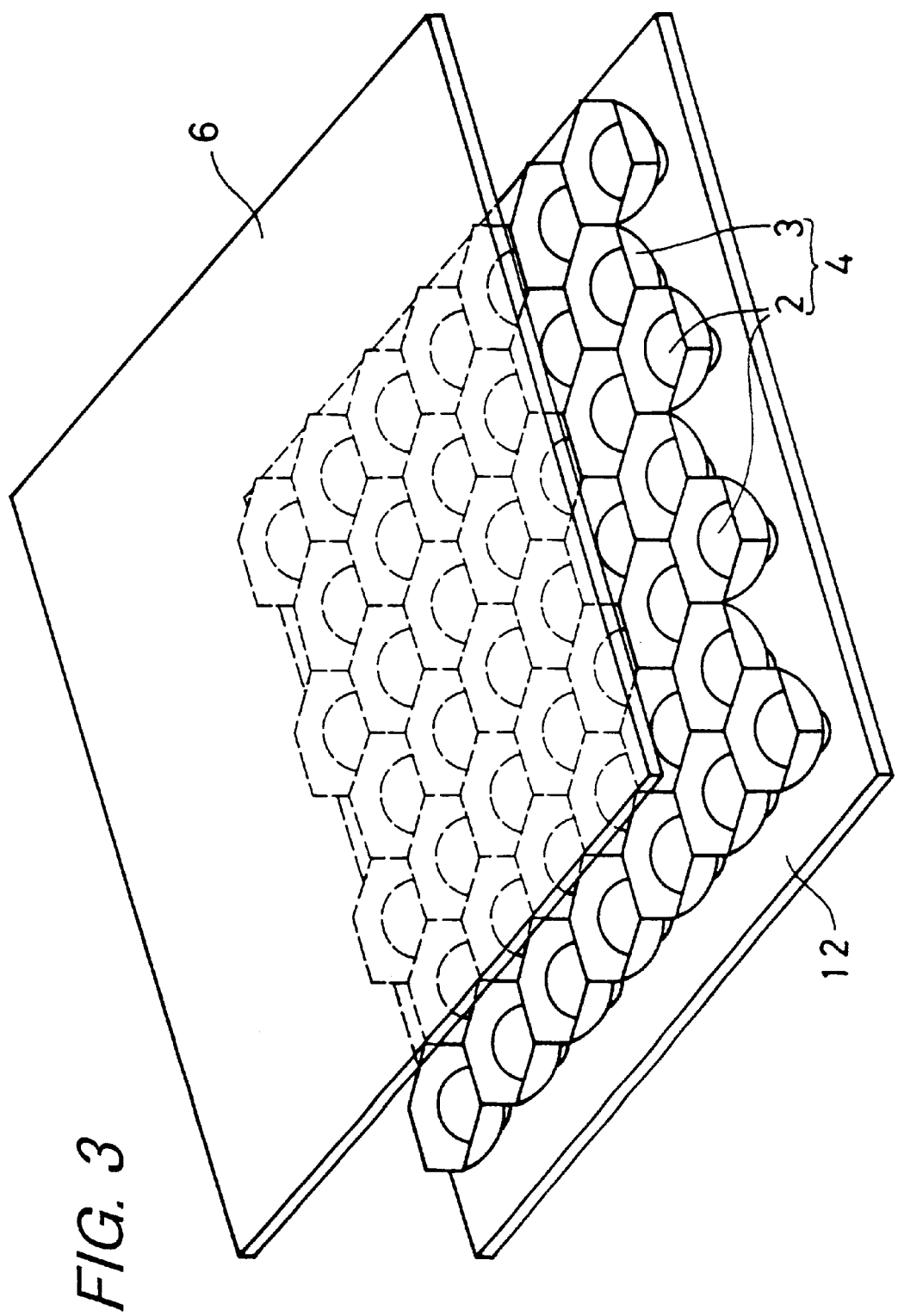
FIG. 3 is an exploded perspective view of the photovoltaic apparatus 1 of FIG. 2.

FIG. 1 is an enlarged sectional view of part of a photovoltaic apparatus 1 according to an embodiment of the present invention. FIG. 2 is a sectional view showing the structure of the photovoltaic apparatus 1. FIG. 3 is an exploded perspective view of the photovoltaic apparatus 1 of FIG. 2. The photovoltaic apparatus 1 has the following basic structure. An assembly 4 of a plurality of generally spherical photoelectric conversion elements 2 and a support 3 that is mounted with the photoelectric conversion elements 2 is buried in a filler layer 5 made of a transparent synthetic resin material such as PVB (poly(vinyl butyral)) or EVA (ethylene vinyl acetate). A transparent protective sheet 6 made of polycarbonate or the like is provided on the light source (e.g., sunlight) side of the filler layer 5 and is fixed to it. A waterproof back sheet 12 is fixed to the surface of the filler layer 5 on the opposite side to the protective sheet 6 (bottom side in FIG. 2). As such, the photovoltaic apparatus 1 assumes, as a whole, a flat-plate shape.

Each photoelectric conversion element 2 has a first semiconductor layer 7 and a second semiconductor layer 8 located outside the first semiconductor layer 7. An opening 9 is formed on the second semiconductor layer 8. A portion 10 (a bottom portion in FIG. 1) of the first semiconductor layer 7 is exposed through the opening 9. When light 11 is applied from above in FIG. 1, photoelectromotive force is generated between the first semiconductor layer 7 and the second semiconductor layer 8 of the photoelectric conversion element 2.

The support 3 is configured in such a manner that an insulator 15 is sandwiched between a first conductor 13 and a second conductor 14. That is, the first conductor 13 and the second conductor 14 are electrically insulated from each other by the insulator 15. Each of the first conductor 13 and the second conductor 14 may be a sheet of aluminum foil or a sheet of another metal. The insulator 15 may be made of a synthetic resin material such as polyimide or some other insulative material. A plurality of recesses 17 are arranged adjacent to each other. The inside surfaces of the recesses 17 are the surface of the first conductor 13. The photoelectric conversion elements 2 are provided at the bottoms of the respective recesses 17.

Figure 4:
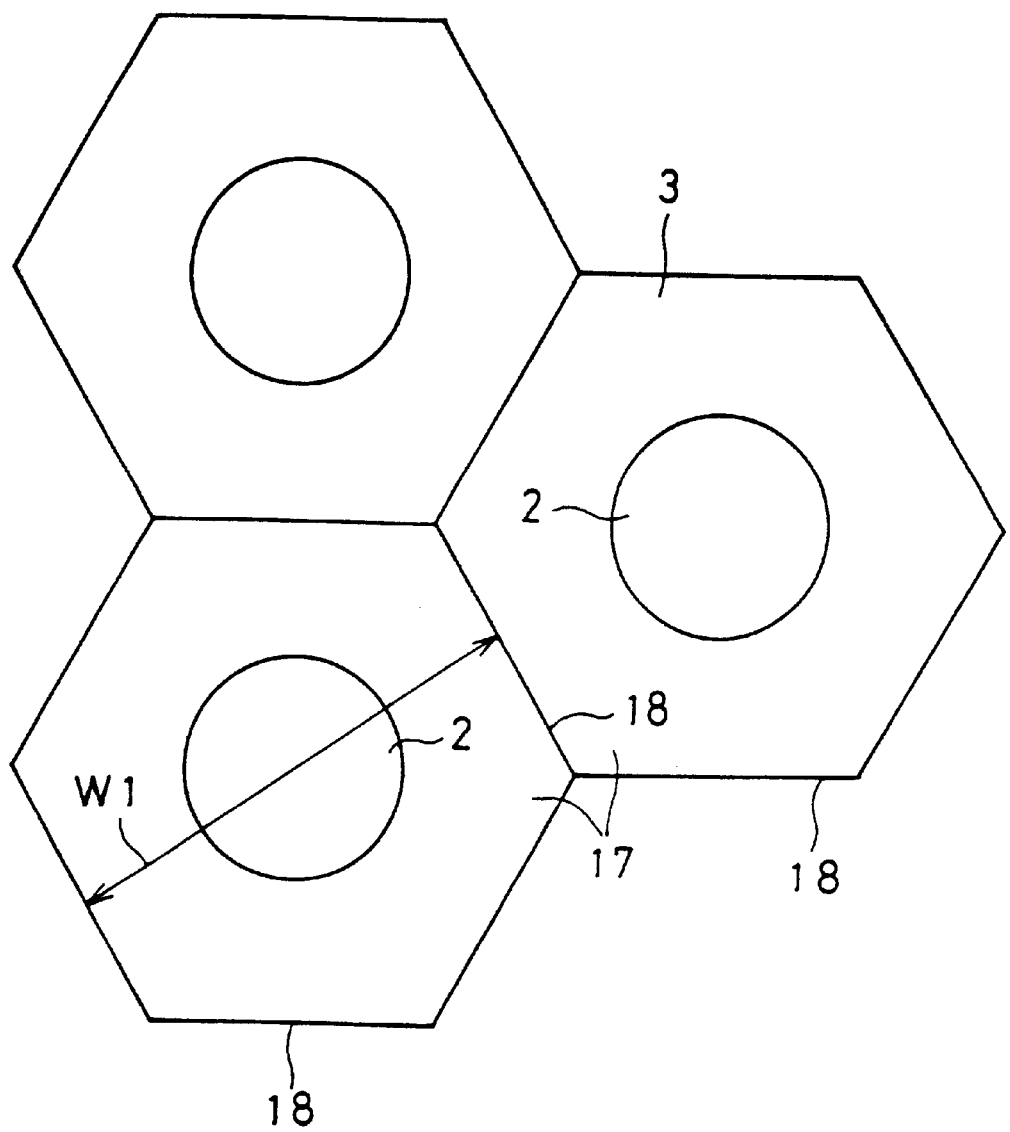
FIG. 4 is a plan view of part of a support 3.

FIG. 4 is a plan view of part of the support 3. In the invention, openings 18 of the recesses 17 assume polygons. In this embodiment, they assume a honeycomb shape, that is, regular hexagons. According to another embodiment of the invention, the opening 18 of each recess 17 assumes another kind of polygon having three or more apices. The length W1 (see FIG. 4) of each opening 18 is 2 mm, for example. The openings 18 which are adjacent to each other are continuous; that is, the recesses 17 are connected to each other by inverted-U-shaped bent portions 19 (see FIG. 1). This structure makes it possible to accommodate as many recesses 17 as possible in the area that is opposed to the light 11, as well as to cause the inside surfaces of the recesses 17 (i.e., the surface of the first conductor 13) to reflect incident light and guide resulting reflection light to the respective photoelectric conversion elements 2. Therefore, this structure provides a large light-gathering ratio.

Each recess 17 narrows toward the bottom and assumes a parabolic cross-section, for example. At the bottom of each recess 17, the first semiconductor layer 7 of the photoelectric conversion element 2 is electrically connected to the second conductor 14 of the support 3 via a connecting portion 21. At the bottom or its neighborhood of each recess 17, the second semiconductor layer 8 of the photoelectric conversion element 2 is electrically connected to the first conductor 13 of the support 3.

Figure 5:
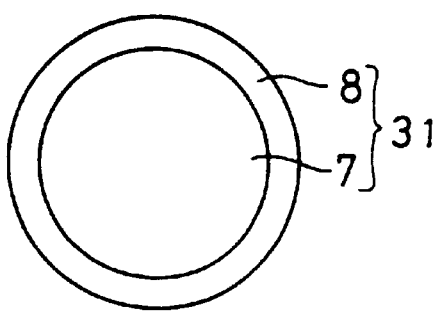
FIG. 5 is a sectional view of a photoelectric conversion element 31 that is a version of each photoelectric conversion element 2 before being mounted on the support 3.

FIG. 5 is a sectional view of a photoelectric conversion element 31 that is a version of each photoelectric conversion element 2 before being mounted on the support 3. The sectional structure of the photoelectric conversion element 31 in FIG. 5 is similar to that of each photoelectric conversion element 2 shown in FIG. 1. A spherical first semiconductor layer 7 is made of n-type silicon, which may be amorphous, single-crystal, or polycrystalline silicon. A second semiconductor layer 8 located outside the first semiconductor layer 7 is made of p-type silicon, which may also be amorphous, single-crystal, or polycrystalline silicon. When the optical band gap of the second semiconductor layer 8 is set wider than that of the first semiconductor layer 7 (e.g., the second semiconductor layer 8 is made of p-type a-SiC), wide gap window action can be attained.

According to another embodiment of the invention, the first semiconductor layer 7 shown in FIG. 5 is made of a direct gap semiconductor that is a semiconductor selected from the group consisting of InAs, $CuInSe_2$, $Cu(InGa)Se_2$, CuInS, GaAs, InGaP, and CdTe that exhibit n-type conductivity. The second semiconductor layer 8 is formed on the first semiconductor layer 7 made of such a direct gap semiconductor. The second semiconductor layer 8 is made of a semiconductor selected from the group consisting of AlGaAs, $CuInSe_2$, $Cu(InGa)Se_2$, GaAs, AlGaP, and CdTe that exhibit p-type conductivity and compound semiconductors similar to those. A pn junction structure is formed in this manner.

Where amorphous semiconductors are used as the first semiconductor layer 7 and the second semiconductor layer 8, a pin junction structure may be formed by forming an i-type semiconductor layer 69 between a first semiconductor layer 68 and the second semiconductor layer 70 (described later; see FIG. 15).

Next, a method for producing the assembly 4 of the photoelectric conversion elements 31 (see FIG. 5) and the support 3 (see FIG. 1) will be described.

Figure 6:
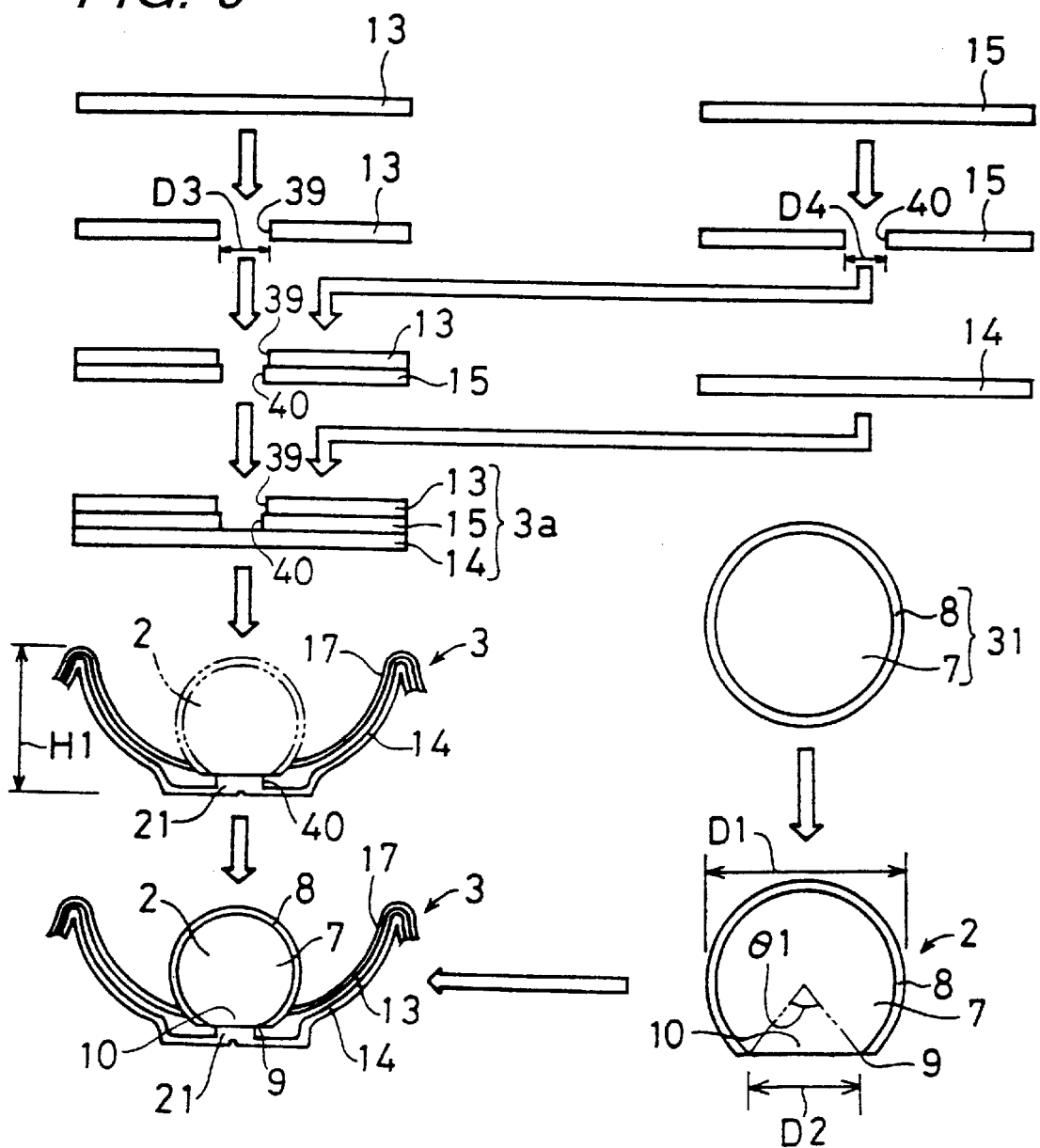
FIG. 6 is a sectional view showing a method for producing an assembly 4 of the photoelectric conversion elements 2 and the support 3.

FIG. 6 is a sectional view showing a method for producing the assembly 4 of the photoelectric conversion elements 2 and the support 3. After the production of the spherical photoelectric conversion elements 31 shown in FIG. 5, the photoelectric conversion elements 2 are cut as shown in FIG. 6. In each of resulting photoelectric conversion elements 2, as shown in FIG. 6, a portion 10 of the first semiconductor layer 7 is exposed through an opening 9 of the second semiconductor layer 8. The opening 9 has such a shape as would be obtained by cutting the photoelectric conversion elements 31 by a plane, and has a central angle θ1 that is less than 180°. The central angle θ1 may be in a range of 45° to 90°, for example. It is preferable that the central angle θ1 be in a range of 60° to 90°. The outer diameter D1 of each photoelectric conversion element 31 may be in a range of 0.5 mm to 2.0 mm, for example. It is preferable that the outer diameter D1 be in a range of 0.8 mm to 1.2 mm. In FIG. 6, symbol D2 represents the inner diameter of the opening 9. The light-gathering ratio x=S1/S2 is in a range of 2 to 8, where S1 is the opening area of each recess 17 of the support 3 and S2 is the area of a cross-section including its center, of each photoelectric conversion element 2. It is preferable that the light-gathering ratio x be in a range of 4 to 6.

Figure 7:
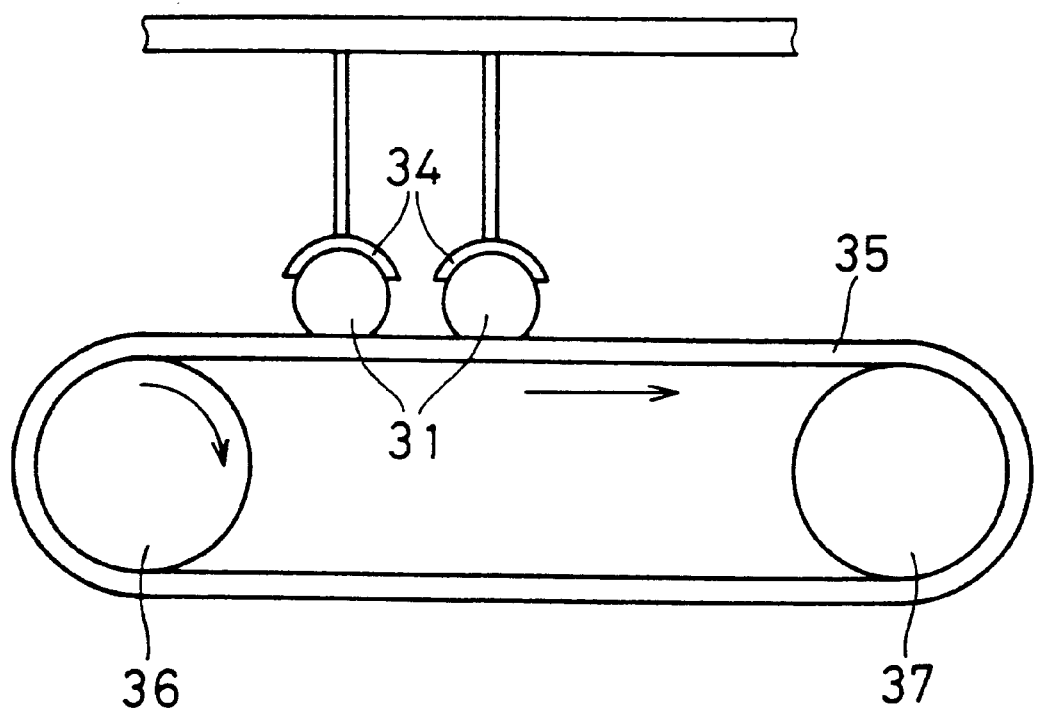
FIG. 7 is a sectional view showing a process for forming an opening 32 by cutting each spherical photoelectric conversion element 31.

FIG. 7 is a sectional view showing a process for forming the opening 9 by cutting each spherical photoelectric conversion element 31. While the top portion of each of spherical photoelectric conversion elements 31 is vacuum-attracted by an attraction pad 34, the spherical photoelectric conversion elements 31 are ground by an endless-belt-shaped abrasive 35. The abrasive 35 is wound on rollers 36 and 37 and is thereby driven rotationally.

Returning to FIG. 6, the support 3 is produced in the following manner. A first conductor 13 made of aluminum foil is prepared and connection holes 39 are formed therein. The inner diameter D3 of each connection hole 39 is set smaller than the outer diameter D1 of each photoelectric conversion element 2 and greater than the inner diameter D2 of the opening 9 of the second semiconductor layer 8 (D1>D3>D2). A thin-plate-shaped insulator 15 is prepared and connection holes 40 are formed therein. The inner diameter D4 of each connection hole 40 is set smaller than the inner diameter D2 of the opening 9 of each photoelectric conversion element 2 (D2>D4). The first conductor 13 having the connection holes 39 is laid on and bonded to the insulator 15 having the connection holes 40, whereby the first conductor 13 and the insulator 15 are integrated with each other. Each pair of connection holes 39 and 40 shares a common axial line. The resulting structure is laid on and bonded to a second conductor 14, whereby they are integrated with each other to produce a flat support 3$a$. According to another embodiment of the invention, the first conductor 13 having the connection holes 39, the insulator 15 having the connection holes 40, and the second conductor 14 are laid one on another and bonded to each other at one time, whereby they are integrated with each other. Each of the first conductor 13, the second conductor 14, and the insulator 15 may have a thickness of 60 $\mu$m, for example. The portion around the opening 9 of each photoelectric conversion element 2 fits into the connection hole 39 and is opposed to the connection hole 40 of the insulator 15. Alternatively, the portion around the opening 9 may be placed on the first conductor 13 so as to be opposed to the connection hole 39.

Reference is also made to FIG. 1. That portion of the outer surface of the second semiconductor layer 8 of each photoelectric conversion element 2 which is located above the opening 9 in FIG. 1 and surrounds the opening 9 is electrically connected to that portion of the first conductor 13 of the support 3$a$ (or 3) which is in the vicinity of the connection hole 39, that is, the inner circumferential face of the connection hole 39 or that portion of the first conductor 13 which is in the vicinity of and surrounds the connection hole 39. A connecting portion 44 (see FIG. 1) where the outer surface of the second semiconductor layer 8 is connected to the first conductor 13 is located on the opposite side (above in FIG. 1), to the second conductor 14, of a periphery 45 of the bottom surface of the photoelectric conversion element 2 containing the opening 9, whereby the first conductor 13 is reliably prevented from being electrically connected to the first semiconductor layer 7. The connecting portion 44 is parallel with the bottom surface of the photoelectric conversion element 2 containing the opening 9 and is closer to the opening 9 (i.e., lower in FIG. 1) than an imaginary plane 47 passing through the center 46 of the photoelectric conversion element 2 is.

Then, the flat support 3$a$ is subjected to plastic deformation, whereby a plurality of recesses 17 are arranged adjacent to each other. The second conductor 14 is so deformed that it projects upward (in FIG. 6) through the connection hole 40 of the insulator 15, i.e., it penetrates through the connection hole 40 and protrudes thereon, to become connecting portions 21. A resulting support 3 may have a height H1 of about 1 mm, for example.

The step of electrically connecting the first semiconductor layers 7 to the second conductor 14 and the step of electrically connecting the second semiconductor layers 8 to the first conductor 13 may be performed either sequentially (either step may be performed first) or simultaneously.

The photoelectric conversion elements 2 each having the opening 9 are accommodated in the respective recesses 17 thus formed.

According to another embodiment of the invention, the support 3 is produced in the following manner. After the 3-layer structure of the first conductor 13, the insulator 15, and the second conductor 14 is plastically deformed so as to form recesses 17, connection holes 39 and 40 are formed in the first conductor 13 and the insulator 15, respectively, by using two kinds of laser light.

Figure 8:
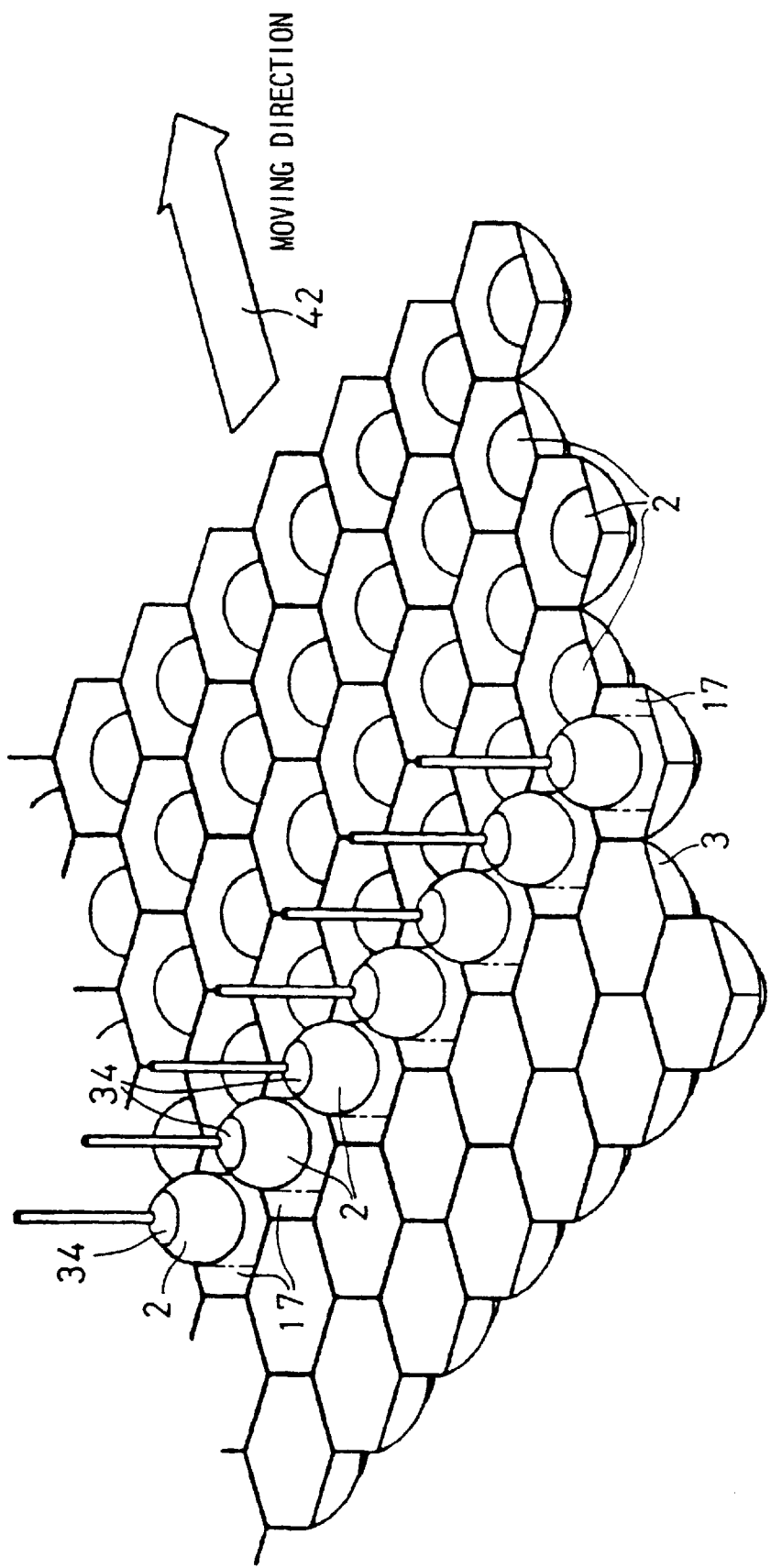
FIG. 8 is a simplified perspective view showing a process for placing the photoelectric conversion elements 2 into respective recesses 17 of the support 3.

FIG. 8 is a simplified perspective view showing a process for putting the photoelectric conversion elements 2 in the respective recesses 17 of the support 3. A set of photoelectric conversion elements 2 produced by cutting photoelectric conversion elements 31 in a state that they are vacuum-attracted by the attraction pads 34 is transported with the openings 9 kept down and put in respective recesses 17 of the support 3. For example, 100 attraction pads 34 are arranged in line. After the set of photoelectric conversion elements 2 is put in the respective recesses 17 by means of the attraction pads 34, the support 3 is moved in a direction 42 by a distance that is equal to one pitch of the recesses 17, another set of photoelectric conversion elements 2 is put in new recesses 17 by using the attraction pads 34 in the same manner as described above. Photoelectric conversion elements 2 are put in all the recesses 17 by repeating the above operation. Then, the operation of electrically connecting each photoelectric conversion element 2 to the support 3 is performed at the bottom of each recess 17.

The first semiconductor layer 7 of each photoelectric conversion element 2 is exposed through the opening 9 and is electrically connected to the connecting portion 21 through the connection hole 40 of the second conductor 14. The portion, above the opening 9, of the outer surface of the second semiconductor layer 8 of each photoelectric conversion element 2 is electrically connected to that portion of the first conductor 13 which is in the vicinity of the connection hole 39. The first semiconductor layer 7 and the second semiconductor layer 8 of each photoelectric conversion element 2 may be connected electrically to the second conductor 14 and the first conductor 13, respectively, by using laser light (formation of an eutectic), conductive paste, or a metal bump. In this manner, the electrical connection is made without using lead-containing solder, which is preferable in terms of the environmental protection.

Figure 9:
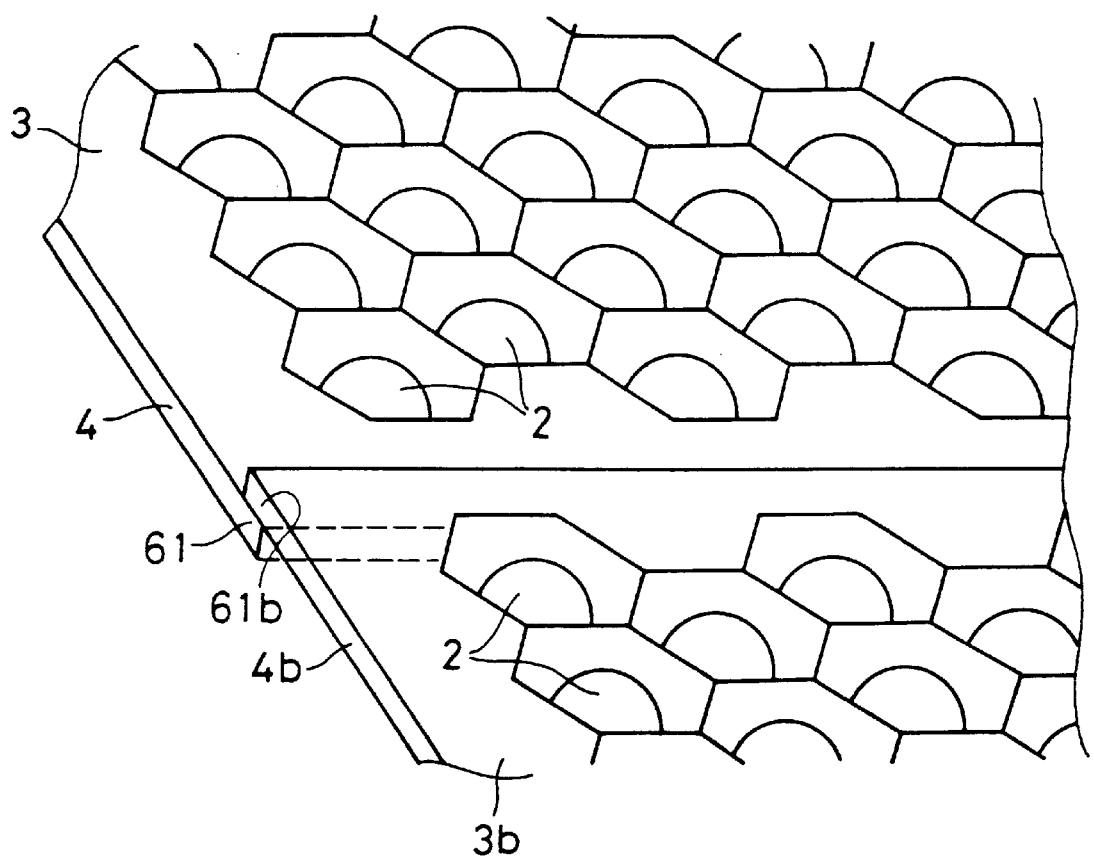
FIG. 9 is a perspective view showing how assemblies 4 and 4b of the photoelectric conversion elements 2 and the support 3 are connected to each other.

FIG. 9 is a perspective view showing how assemblies 4 and 4$b$ of the photoelectric conversion elements 2 and the support 3 are connected to each other. The assemblies 4 and 4$b$ are electrically connected to each other at their flat peripheral portions 61 and 61$b$ extending outward.

Figure 10:
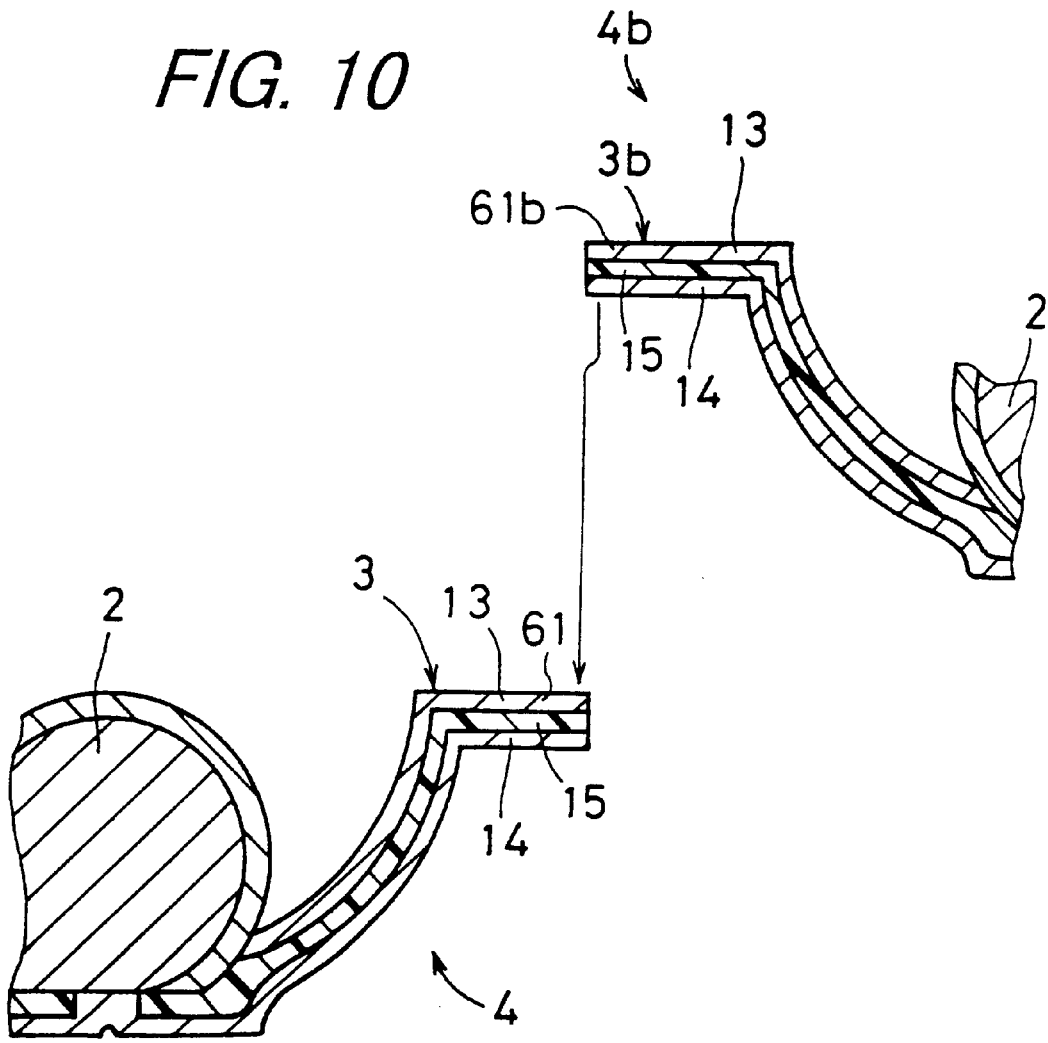
FIG. 10 is an exploded sectional view of peripheral portions 61 and 61b and their vicinities of the assemblies 4 and 4b shown in FIG. 9.

FIG. 10 is an exploded sectional view of the peripheral portions 61 and 61$b$ and their vicinities of the assemblies 4 and 4$b$ shown in FIG. 9. The second conductor 14 of the support 3$b$ of the one assembly 4$b$ is laid on, electrically connected to, and fixed to the first conductor 13 of the support 3 of the other assembly 4. In this manner, photo-electromotive forces, generated by the photoelectric conversion elements 2, of the assemblies 4, 4$b$, . . . are connected to each other in series, whereby a desired high voltage can be output.

Figure 11:
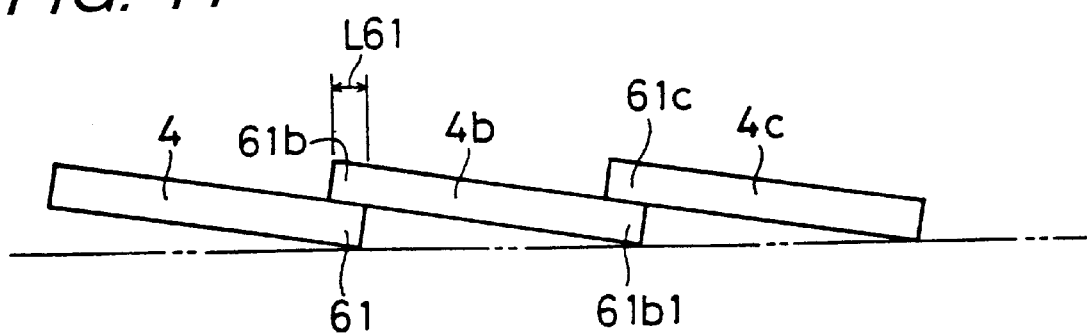
FIG. 11 is a simplified side view showing how assemblies 4, 4b, and 4c are electrically connected to each other.

FIG. 11 is a simplified side view showing how assemblies 4, 4$b$, and 4$c$ are electrically connected to each other. The peripheral portion 61b of the assembly 4b is laid on and electrically connected to the peripheral portion 61 of the assembly 4 in the above-described manner. Further, the peripheral portion 61c of the assembly 4c is laid on and electrically connected to the peripheral portion 61b1 (located on the opposite side to the peripheral portion 61b) of the assembly 4b. In the structure of FIG. 11, the one peripheral portion 61b of the assembly 4b is located above the peripheral portion 61 of the assembly 4 and the other peripheral portion 61b1 of the assembly 4b is located below the peripheral portion 61c of the assembly 4c. In this manner, the assemblies are connected to each other in such a manner that the two peripheral portions of each assembly are located above and below the two adjacent assemblies, respectively, to thereby form a two-step structure. The length L61 of overlap, in the right-left direction in FIG. 11, between the peripheral portions 61 and 61b and between the peripheral portions 61b1 and 61c may be set at 1 mm, for example.

Figure 12:
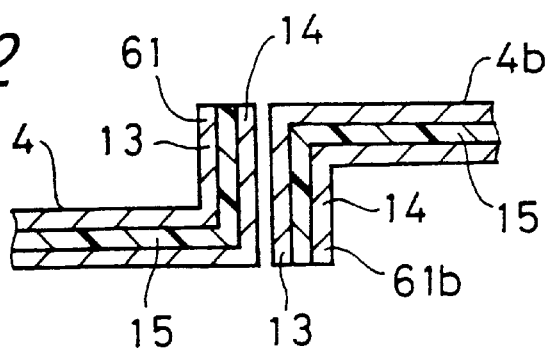
FIG. 12 is a sectional view showing an electrical connection structure of assemblies 4 and 4b that are adjacent to each other according to another embodiment of the invention.

FIG. 12 is a sectional view showing an electrical connection structure of assemblies 4 and 4b that are adjacent to each other according to another embodiment of the invention. The peripheral portion 61 of the one assembly 4 projects upward and the peripheral portion 61b of the other assembly 4b projects downward. The second conductor 14 of the peripheral portion 61 is electrically connected to the first conductor 13 of the peripheral portion 61b.

Figure 13:
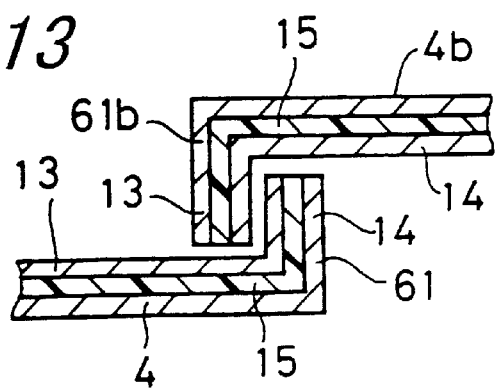
FIG. 13 is a sectional view showing an electrical connection structure of assemblies 4 and 4b that are adjacent to each other according to still another embodiment of the invention.

FIG. 13 is a sectional view showing an electrical connection structure of assemblies 4 and 4b that are adjacent to each other according to still another embodiment of the invention. This embodiment is similar to the embodiment of FIG. 12 and is different from the latter in that the first conductor 13 of the peripheral portion 61 (projecting upward) of the assembly 4 is electrically connected to the second conductor 14 of the peripheral portion 61b (projecting downward) of the assembly 4b. The connection structures of FIGS. 12 and 13 make it possible to make the recesses 17 of the supports 3 and 3b closer to each other and thereby arrange as many recesses 17 and photoelectric conversion elements 2 as possible in a limited area.

Figure 14:
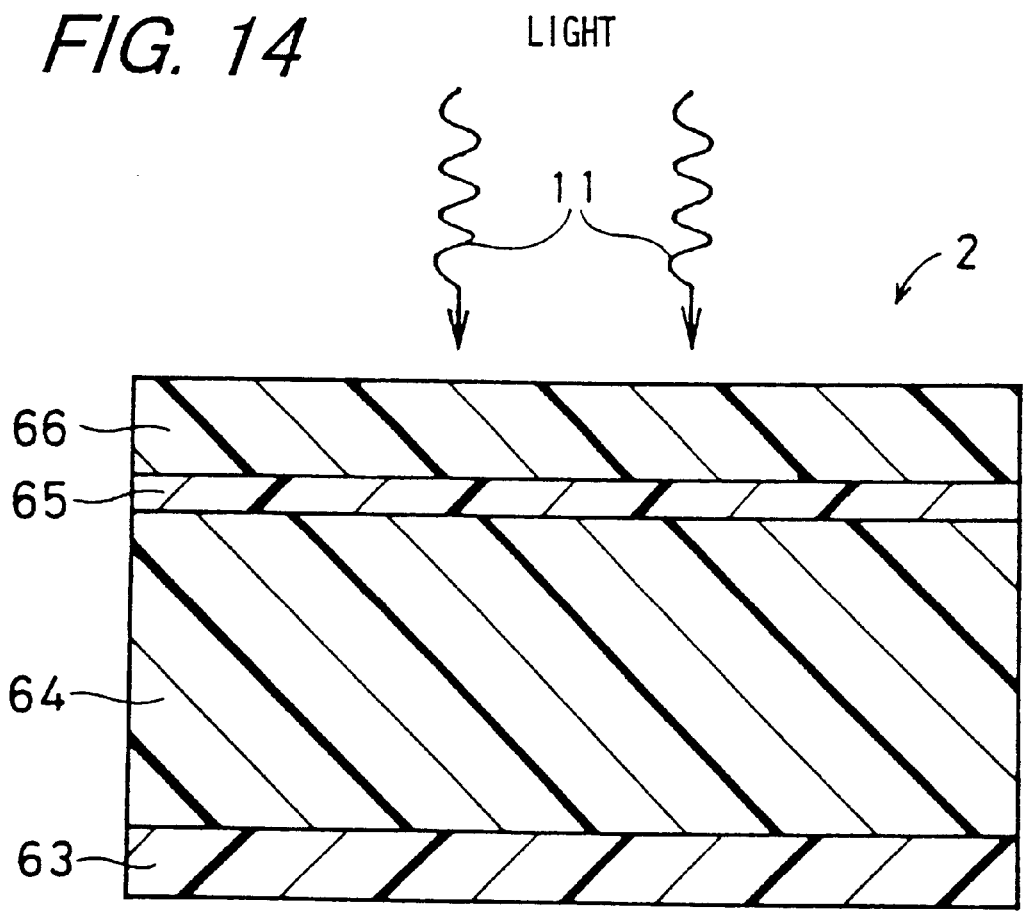
FIG. 14 is a sectional view of part of a photoelectric conversion element 2 according to another embodiment of the invention.

FIG. 14 is a sectional view of part of a photoelectric conversion element 2 according to another embodiment of the invention. Although in FIGS. 14–16 each semiconductor layer is drawn as having a flat shape (developed in the circumferential direction), actually the semiconductor layers are laid one on another outward (upward in FIGS. 14–16) in the radial direction so as to have spherical surfaces.

In the photoelectric conversion element 2 of FIG. 14, an n-type microcrystalline (μc) silicon layer 63, an n-type polysilicon layer 64, a p-type a-SiC layer 65, and a p-type microcrystalline SiC layer 66 (the layers 64–66 form a double heterojunction layer) are laid one on another outward in the radial direction. The structures of the photoelectric conversion elements 2 of FIGS. 14–16 each having a pn junction are summarized in Table 1.

TABLE 1

| FIG. | Reference numeral | Layer |
| --- | --- | --- |
| 14 | 66 | p μc-SiC |
|  | 65 | p a-SiC |
|  | 64 | n poly-Si |
|  | 63 | n μc-Si |
| 15 | 70 | p a-SiC |
|  | 69 | i a-SiC |
|  | 68 | n μc-Si |

TABLE 1-continued

| FIG. | Reference numeral | Layer |
| --- | --- | --- |
| 16 | 77 | p μc-SiC |
|  | 76 | p a-SiC |
|  | 75 | i a-SiC |
|  | 74 | i a-Si |
|  | 73 | n μc-Si |

Figure 15:
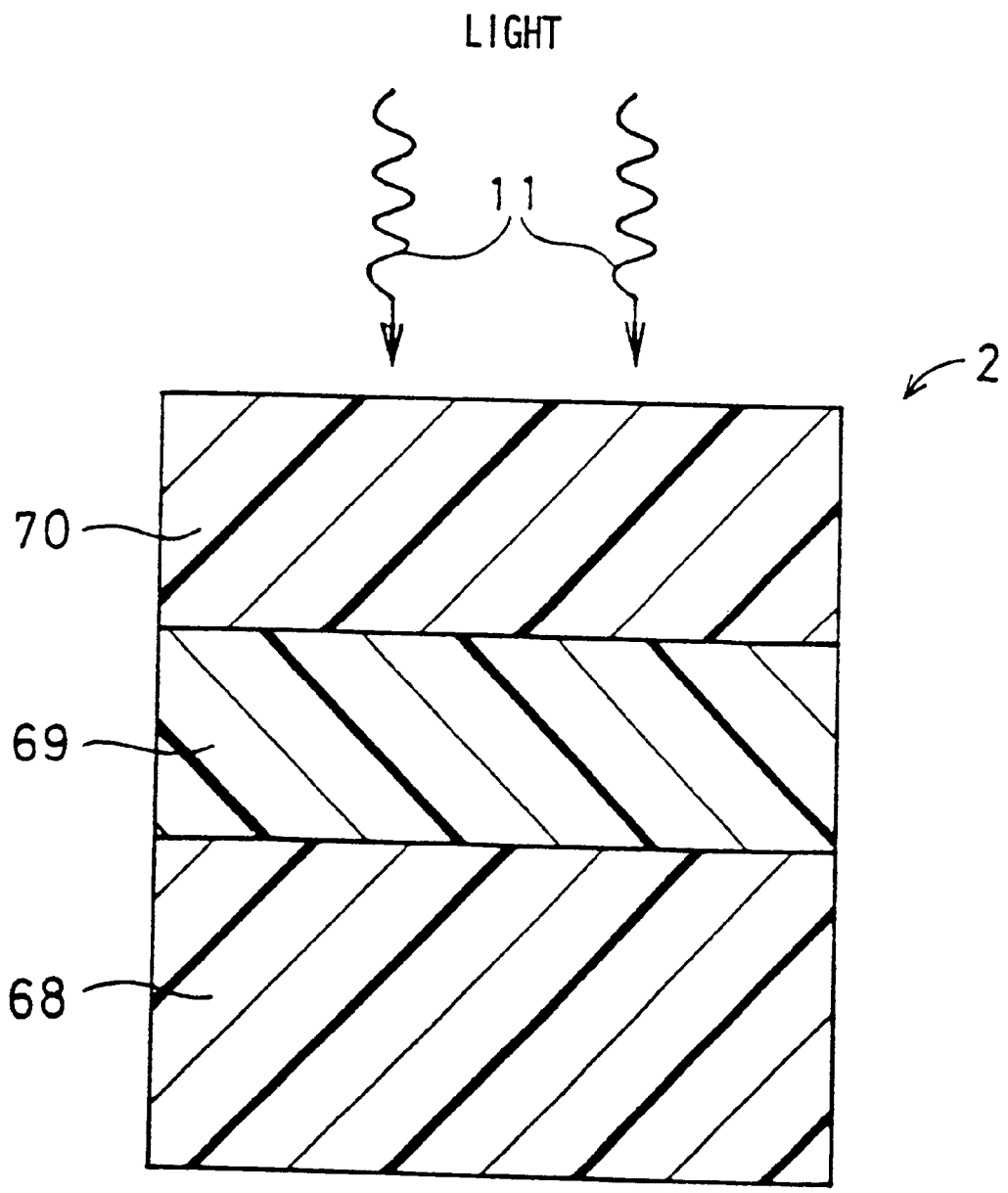
FIG. 15 is a sectional view of part of a photoelectric conversion element 2 according to still another embodiment of the invention.

FIG. 15 is a sectional view of the photoelectric conversion element 2 according to still another embodiment of the invention. The details of semiconductor layers 68–70 are as shown in Table 1. Alternatively, in the photoelectric conversion element 2 of FIG. 15, the semiconductor layer 68 may be made of n-type single-crystal or polycrystalline silicon.

Figure 16:
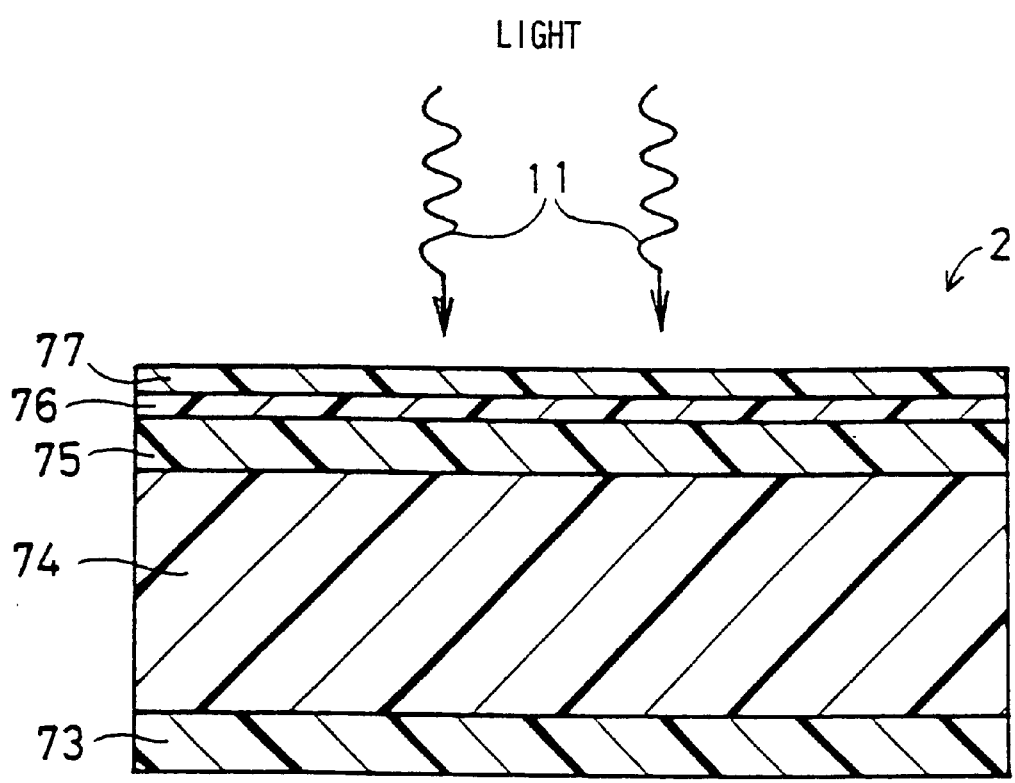
FIG. 16 is a sectional view of part of a photoelectric conversion element 2 according to yet another embodiment of the invention.

FIG. 16 is a sectional view of the photoelectric conversion element 2 according to yet another embodiment of the invention. The details of semiconductor layers 73–77 are as shown in Table 1. Alternatively, the semiconductor layers 73 and 74 in FIG. 16 are made of n-type single-crystal silicon. The semiconductor layer 74 may be made of i-type microcrystalline silicon.

In the invention, the photoelectric conversion element 2 may have structures other than described above.

According to another embodiment of the invention, the support 3 may be replaced by another type of support that is produced by forming a structure having recesses by molding (e.g., injection-molding) an insulative synthetic resin material (e.g., polycarbonate), for example, and plating a conductive material such as Ni on its surfaces to form first and second conductors. The first and second conductors may be made of aluminum foil, for example. Alternatively, they may be formed by Cr plating or Ag plating. As a further alternative, they may be formed by evaporating or sputtering a metal of Ni, Cr, Al, Ag, or the like. A coating may be formed on the first conductor, and the coating may be made of a metal (formed by plating or the like) or a synthetic resin.

Figure 17:
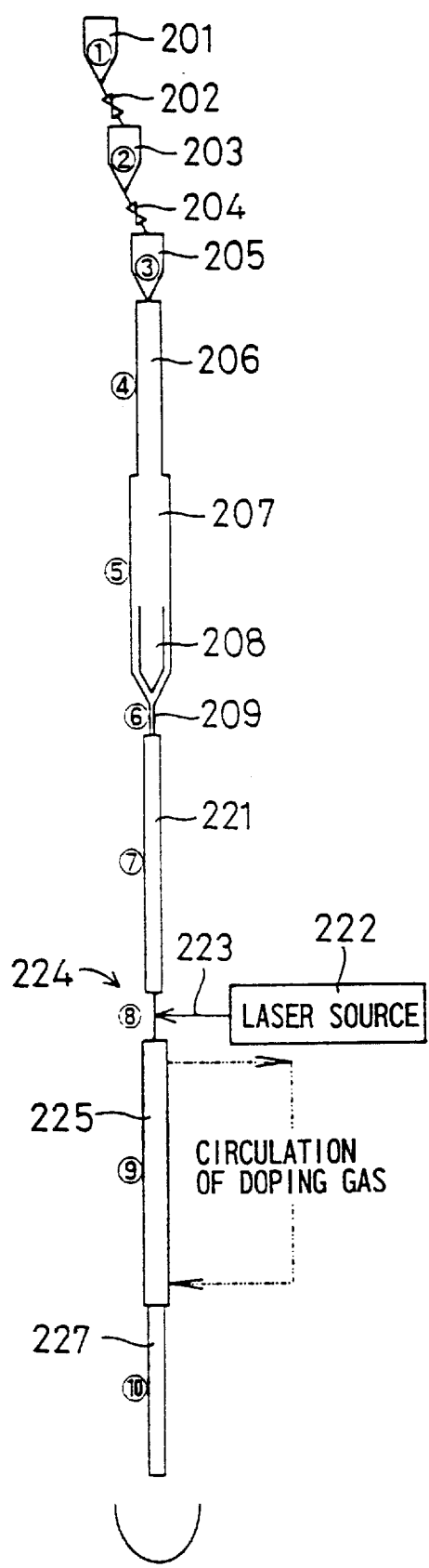
FIG. 17 shows, in a simplified manner, the entire configuration of a spherical semiconductor particle mass-producing apparatus according to another aspect of the invention.
Figure 18:
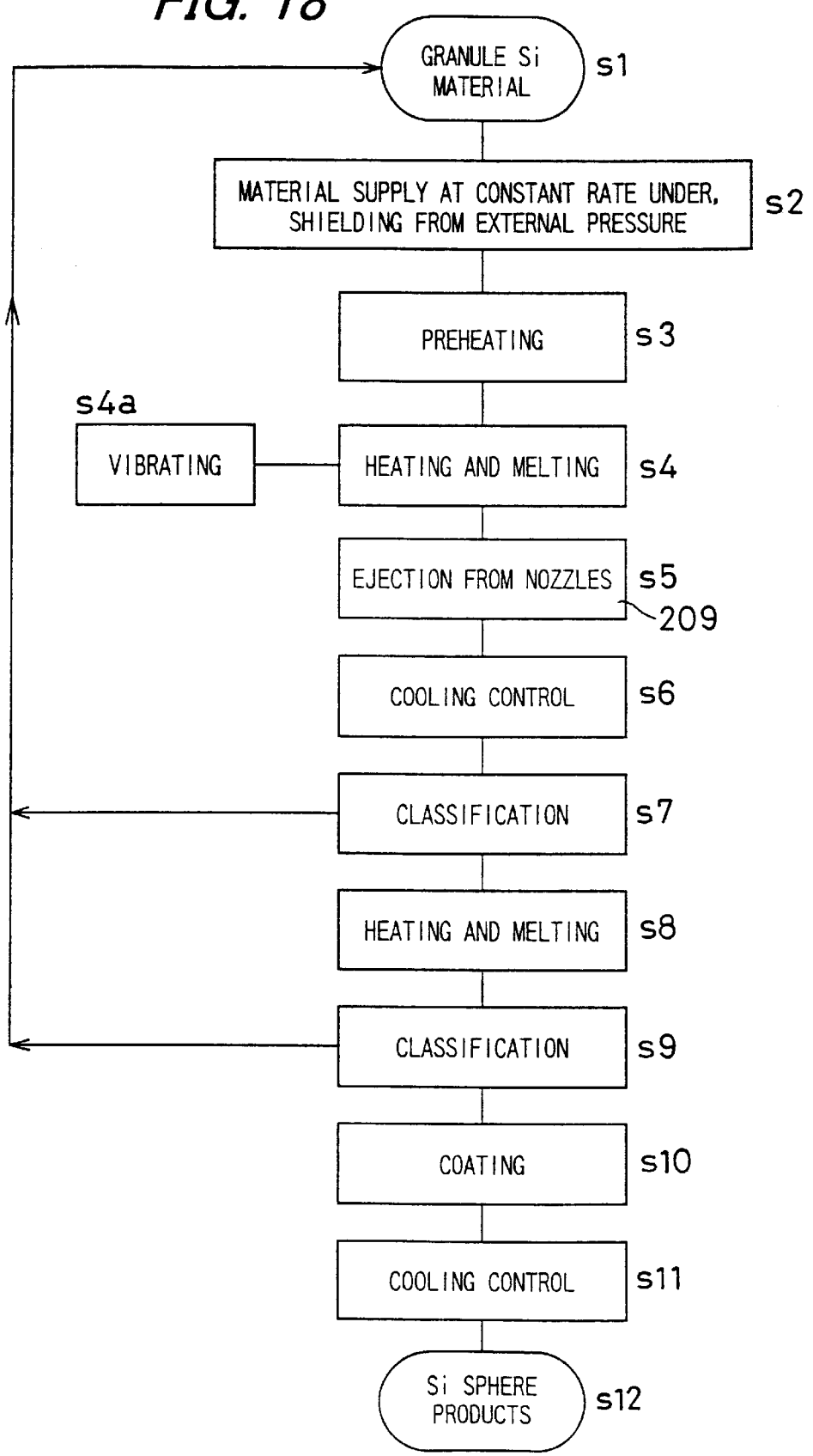
FIG. 18 is a flowchart showing the operation of the apparatus of FIG. 17.

FIG. 17 shows, in a simplified manner, the entire configuration of a spherical semiconductor particles mass-producing apparatus according to another aspect of the invention. FIG. 18 is a flowchart showing the operation of the apparatus of FIG. 17. To mass-produce spherical semiconductor particles made of silicon to be used for manufacturing a photovoltaic apparatus etc., first, a silicon semiconductor material is supplied to a top hopper 201. The inside of the hopper 201 is always kept at normal pressure. The material is supplied from the hopper 201 to an intermediate hopper 203 via an opening/closing valve 202. The inside of the intermediate hopper 203 is kept at normal pressure while it receives the material, and at an operating pressure while it supplies the material. The material is supplied from the intermediate hopper 203 to a bottom hopper 205 via an opening/closing valve 204. The inside of the bottom hopper 205 is always kept at the operating pressure. The material in a solid state stays in the bottom hopper 205. In this manner, at step s1 in FIG. 18, a granulated silicon semiconductor material is supplied to the top holler 201. At step s2, with the actions of the opening/closing valves 202 and 204, the material is supplied from the top hopper 201 to the bottom hopper 205 via the intermediate hopper 203 at a constant rate in a state that shielding from the external pressure is made.

At step s3, in a solid-state preheating section 206, the material supplied from the bottom hopper 205 is preheated by high-frequency induction heating. According to another embodiment of the invention, instead of high-frequency induction heating, radiation heating is performed in a reverberatory furnace, an electric furnace, or the like.

At step s4, the material that has been preheated in the solid-state preheating section 206 is heated and thereby melted in a melting section 207. In the melting section 207, the material may be melted by high-frequency induction heating as in the solid-state melting section 206. According to another embodiment of the invention, the material is heated and melted by radiation heating using a reverberatory furnace, an electric furnace, or the like. The melting section 207 incorporates a crucible 208, and a molten semiconductor is temporarily stored in the crucible 208. The molten semiconductor in the crucible 208 is pressurized by the operating pressure generated in the space over the molten semiconductor in the crucible 208 while being vibrated (step s4a). The bottom of the crucible 208 is provided with a plurality of nozzles 209, through which the molten semiconductor is dropped at a constant flow rate corresponding to the pressure generated in the space over the molten semiconductor in the crucible 208. Alternatively, the bottom of the crucible 208 is provided with a single nozzle 209.

Figure 19:
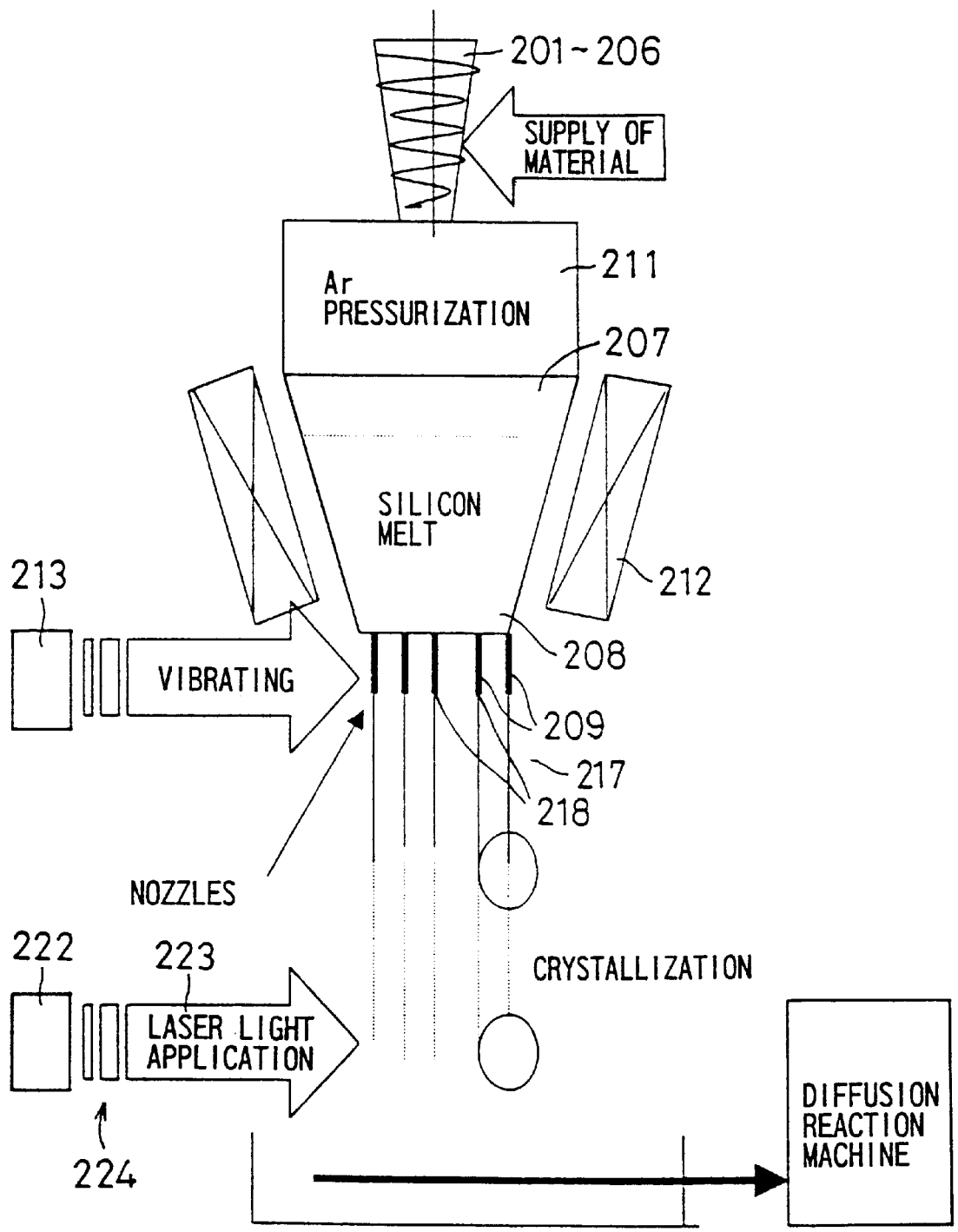
FIG. 19 shows, in a simplified manner, a configuration for supplying a molten semiconductor from a crucible 208 to nozzles 209 and dropping it from the nozzles 209.

FIG. 19 shows, in a simplified manner, a configuration for supplying the molten semiconductor from the crucible 208 to the nozzles 209 and dropping it from the nozzles 209. In the melting section 207, pressurizing means 211 generates pressure in the space over the molten semiconductor in the crucible 208 using an inert gas such as Ar gas or $N_2$ gas. The semiconductor in the crucible 208 is heated by the heating means 212 and thereby melted as mentioned above. The molten semiconductor flows dropping from the nozzles 209 are vibrated by vibrating means 213.

Figure 20:
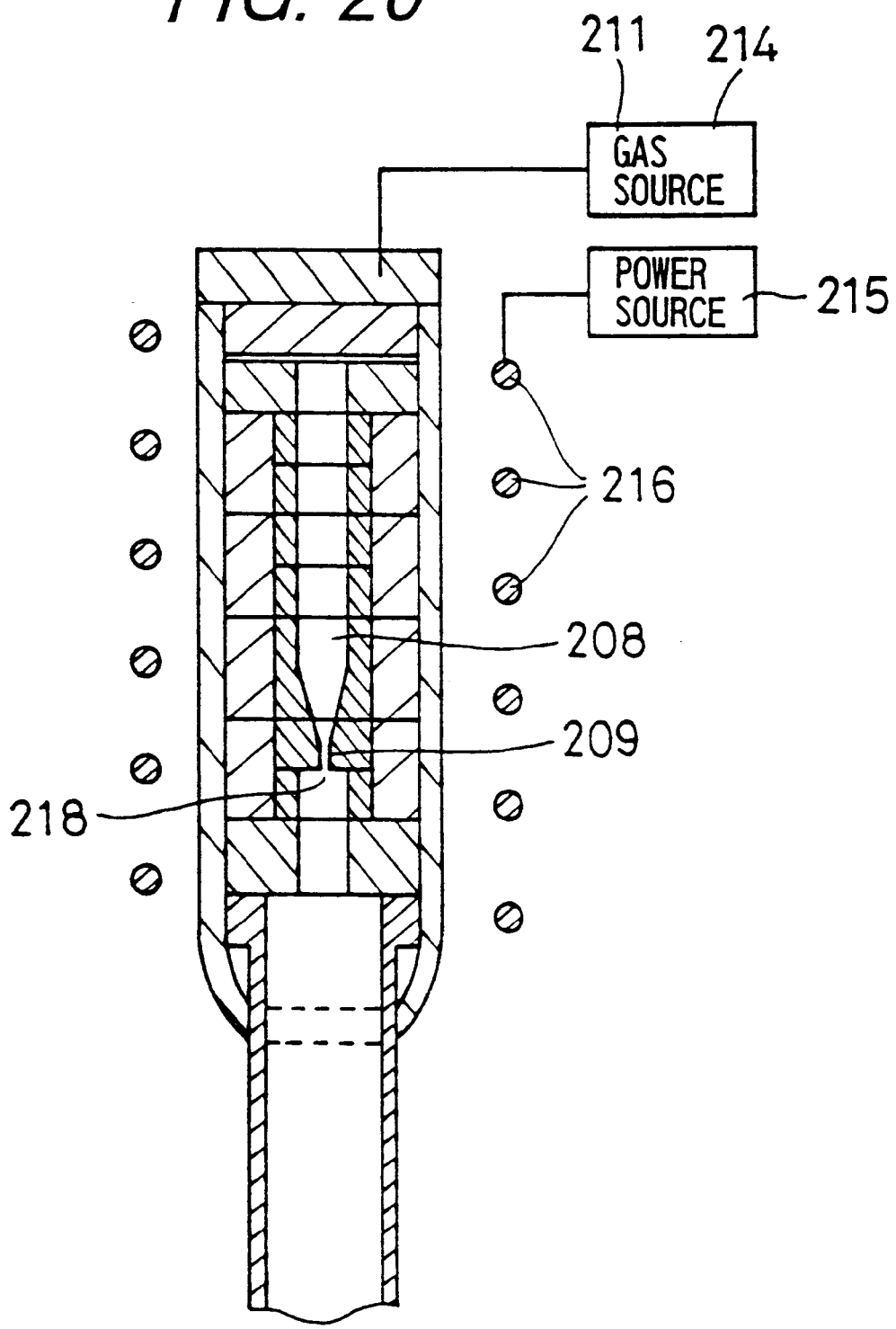
FIG. 20 is a simplified sectional view of a melting section 207.

FIG. 20 is a simplified sectional view of the melting section 207. Including a gas source 214, the pressurizing means 211 supplies an inert gas to the space over the molten semiconductor in the crucible 208. To heat and melt the semiconductor in the crucible 208 by induction heating, high-frequency power at 200 to 500 kHz, for example, is supplied from a high-frequency power source 215 to an induction heating coil 216 that surrounds the crucible 208. In this manner, the semiconductor in the crucible 208 is induction-heated. The crucible 208 is made of a refractory conductive material such as carbon or graphite. Each nozzle 209 has an inner diameter of 1±0.5 mm and a length of 1 mm to 100 mm (preferably 5 mm to 10 mm). In this manner, the molten semiconductor can be dropped from the nozzles 209 at a flow rate corresponding to the gas pressure that is generated by the gas source 214 in the space over the molten semiconductor, for example, at a predetermined constant flow rate. The pressure of the space 217 with which nozzle outlets 218 of the respective nozzles 209 communicate is atmospheric pressure.

According to another embodiment of the invention, instead of generating a gas pressure by the gas source 214 in the space over the molten semiconductor, the space over the molten semiconductor in the crucible 208 is given atmospheric pressure and the pressure of the space 217 with which the nozzle outlets 218 of the respective nozzles 209 communicate is set lower than the pressure of the space over the molten semiconductor in the crucible 208. The semiconductor in the crucible 208 may be heated and melted by means of resistive heating means having an electric heater that is attached to the crucible 208 or provided in its neighborhood.

The molten semiconductor flows dropping from the nozzles 209 are vibrated while receiving sound waves of 10 Hz to 1 kHz from the vibrating means 213. Alternatively, the oscillation frequency may be in an ultrasonic range.

Figure 21:
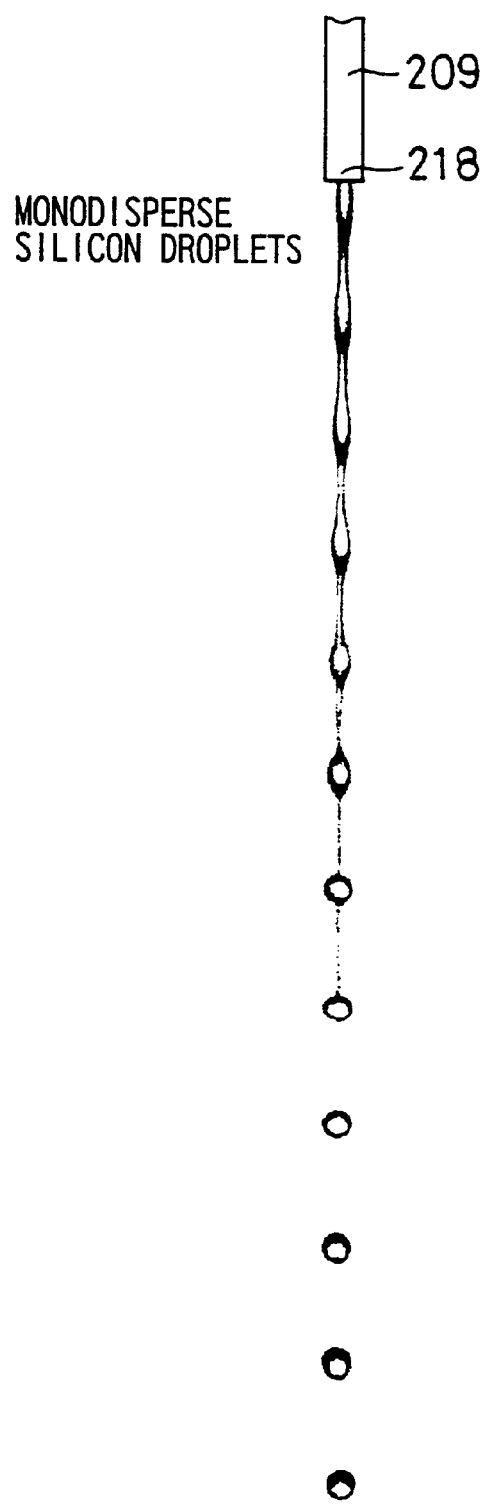
FIG. 21 shows how spherical particles are formed of a molten semiconductor dropping from the nozzle outlet 218 of each nozzle 209.

FIG. 21 shows how spherical particles are formed of the molten semiconductor dropping from the nozzle outlet 218 of each nozzle 209. The molten semiconductor as dropped from the nozzle outlet 218 is continuous in the vertical direction. However, as the molten semiconductor drops further, it is divided in the vertical direction into particles by the vibrating action of the vibrating means 213.

Figures 22A, 22B, 22C, 22D:
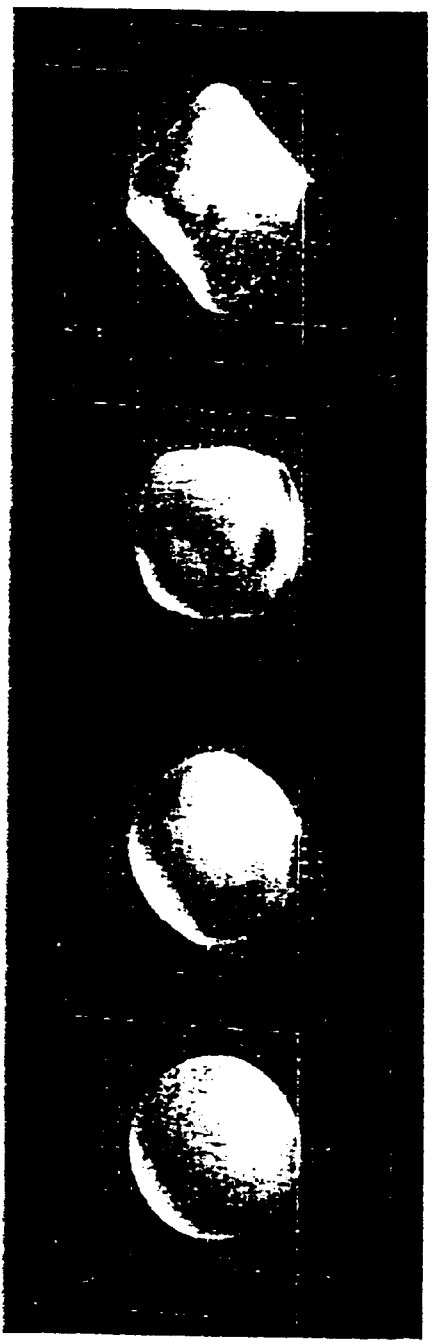
FIGS. 22A–22D show results of a simulation performed by the present inventor that shows how a dropping cubic molten semiconductor particle changes its shape into a sphere.

FIGS. 22A–22D show results of a simulation performed by the present inventor that shows how a dropping cubic molten semiconductor particle changes its shape into a sphere. FIG. 22A shows a separated molten semiconductor particle after being dropped from a nozzle 209. The molten semiconductor particle is gradually rounded as shown in FIGS. 22B and 22C, and finally assumes an approximately complete sphere as shown in FIG. 22D.

According to another embodiment of the invention, each nozzle 209 is so driven that its nozzle outlet 218 is vibrated in the direction perpendicular to its axial line (i.e., in the right-left direction in FIGS. 19–21) and the amplitude A of the right-left vibration of each nozzle 218 is set smaller than ½ of the diameter D1 of particles to be formed. This method can also produce particles having an accurate diameter D1. According to still another embodiment of the invention, each nozzle 209 is vibrated along its axial line, that is, in the top-bottom direction in FIGS. 19–21. The nozzles 209 may be either rigid or elastic.

Returning to FIGS. 17 and 18, the molten semiconductor flows dropping from the nozzles 209 change their shapes into particles. As the particles pass through a cooling cylinder 221, their sphericity increases and their surfaces become smoother. A cooling control (step s6 in FIG. 18) is performed in the cooling cylinder 221. At step s7, cooled particles are classified; for example, only particles whose diameter D1 is in a range of 1±0.5 mm are selected. At step s8, the selected particles are illuminated with laser light 223 that is emitted from a laser source 222. Specifically, at step s8, the solid-state particles dropping from the nozzles 209 are illuminated with the laser light 223 in a vapor phase and thereby heated and re-melted. As a result, each particle becomes a single crystal or a polycrystal while development of cracks on the surface is prevented and the particle is prevented from becoming amorphous. The laser source 222 serves to crystallize particles and constitutes crystallizing means 224. The particles thus crystallized are classified again at step s9; only particles whose diameter D1 is in the above-mentioned range of 1±0.5 mm are selected and guided to surface layer forming means 225. At step s10, coating is performed. Specifically, in the surface layer forming means 225, single-crystal or polycrystalline semiconductor particles of one conductivity type (e.g., p-type) pass through a passage where a diffusion source containing atoms or molecules with which the surface layers of the particles are to be doped exists in the form of a vapor phase, whereby surface layers of the other conductivity type (e.g., n-type) are formed. The passage extends vertically, and surface layer diffusion occurs as the particles drop through the passage. The diffusion source may be $P_2O_5$, $POCl_3$, $PH_3$, or the like. In this manner, surface layers are formed by a vapor phase diffusion method. According to another embodiment of the invention, particles on whose surfaces a diffusion material is deposited as they pass through the passage are heated again to form surface layers having a desired thickness; surface layers are formed by a solid-state diffusion method. Surface layers may be formed by vacuum evaporation.

The particles that have been formed with the surface layers are subjected to a cooling control in a cooling cylinder 227 (step s11). In this manner, the sphericity is increased and the surface layers are controlled so as to be kept in desired states, whereby photoelectric conversion elements having no cracks etc. and being superior in sphericity and surface shape are obtained at step s12.

FIGS. 23A and 23B are sectional views of a semiconductor particle according to another embodiment of the invention. It has been found that a particle (see FIG. 23A) obtained by crushing a silicon semiconductor is changed to a spherical particle shown in FIG. 23B by heating and melting the particle by illuminating it for 10 ms with laser light 223 of 20 W that is emitted from a YAG laser source 222 while the particle is dropping in a vapor phase. Particles that are formed in this manner are superior in crystallinity.

Figure 24:
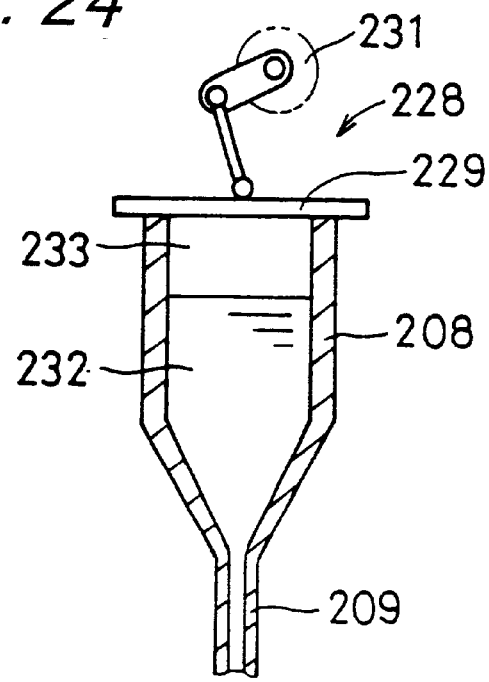
FIG. 24 is a simplified sectional view of vibrating means 228 according to another embodiment of the invention.

FIG. 24 is a simplified sectional view of vibrating means 228 according to another embodiment of the invention. This vibrating means 228 has a diaphragm 229 that communicates with the space over the semiconductor in the crucible 208 and a driving source 231 for reciprocating the diaphragm 229 in the vertical direction in FIG. 24. The driving source 231 may have a motor and a crank mechanism that is driven by the motor. As the diaphragm 229 moves in the vertical direction in FIG. 24, the pressure acting on the space 233 over a molten semiconductor 232 varies periodically to effect vibration.

Figure 25:
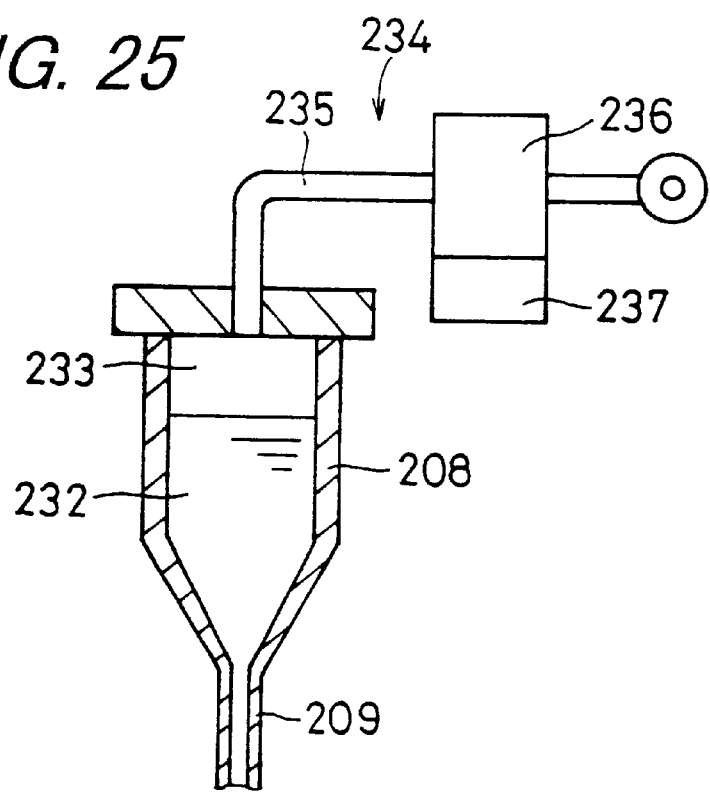
FIG. 25 is a simplified sectional view of vibrating means 234 according to still another embodiment of the invention.

FIG. 25 is a simplified sectional view of vibrating means 234 according to still another embodiment of the invention. A driving chamber 236 communicates with the space 233 over the semiconductor 232 in the crucible 208 via a tube 235. A driving source 237 periodically varies the capacity, and hence the inside pressure, of the driving chamber 236 and hence the pressure. In this manner, the pressure of the space 233 can be varied and hence the molten semiconductor 232 can be vibrated.

Figure 26:
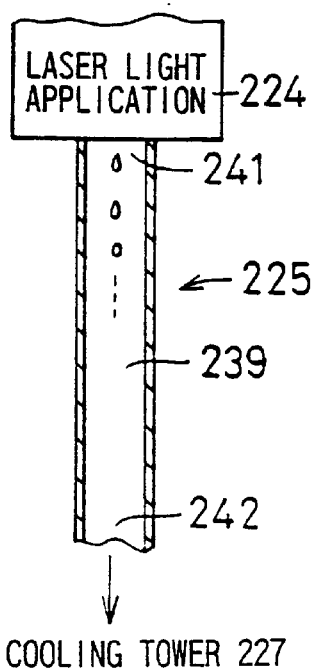
FIG. 26 is a sectional view showing a specific configuration of surface layer forming means 225.

FIG. 26 is a sectional view showing a specific configuration of the surface layer forming means 225. Particles that have been crystallized and solidified by the crystallizing means 224 are formed with surface layers by the surface layer forming means 225 in the above-described manner. In the embodiment, silicon spheres are formed with surface diffusion layers by a gas diffusion method. A description will be made below of an exemplary method by which p-type silicon spheres are each formed with a shallow n-type diffusion layer. The diffusion source is $P_2O_5$, $POCl_3$, $PH_3$, or the like. First, an inert gas containing the diffusion source and a slight amount of hydrogen is introduced to a diffusion layer forming space 239 that is adjacent to the laser light application space and is separated from the latter in terms of atmosphere and the diffusion layer forming space 239 is filled with the inert gas. The diffusion layer forming space 239 measures about 5 m in the vertical direction and the temperatures of a top portion 241 and a bottom portion 242 a reset at about 1,400° C. and about 1,350° C., respectively. After being re-crystallized with high quality by illumination with laser light, p-type silicon spheres pass through the diffusion layer forming space 239 from the top portion 241 to the bottom portion 242 while being kept at a high temperature. The p-type silicon spheres take about one second to pass through the diffusion layer forming space 239. As the p-type silicon spheres pass through the diffusion layer forming space 239, each of them is formed, over the entire surface, with an n-type diffusion layer at a depth of about 0.5 $\mu$m that is necessary for each silicon sphere to function as a solar cell. This step can be executed continuously so as to produce a large number of silicon spheres each formed with a surface layer by introducing the inert gas continuously and properly controlling the gas atmosphere of the diffusion layer forming space 239.

Figure 27:
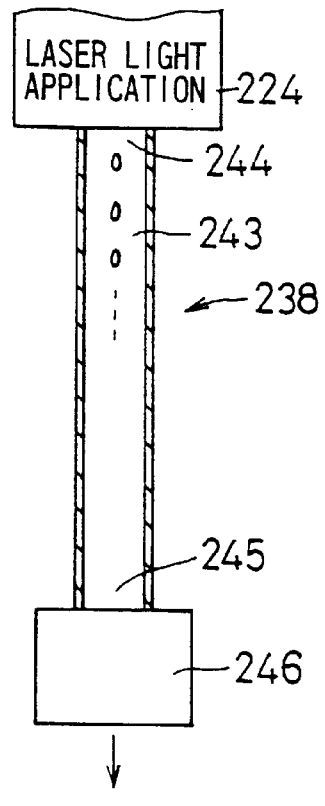
FIG. 27 shows, in a simplified manner, the configuration of surface layer forming means 238 according to another embodiment of the invention.

FIG. 27 shows, in a simplified manner, the configuration of surface layer forming means 238 according to another embodiment of the invention. In this embodiment, the temperature of a diffusion layer forming space 243, which is similar to the above-described diffusion layer forming space 239, is set at about 1,200° C. P-type silicon spheres are caused to pass through the diffusion layer forming space 243 from a top portion 244 to a bottom portion 245 in about one second in the same manner as described above. As the silicon spheres pass through the diffusion layer forming space 243, they are formed, over the entire surfaces, with shallow n-type diffusion layers of about 0.1 $\mu$m in depth. Then, a number of resulting silicon spheres are put on a container 246 made of quartz or the like and then heat-treated again at 900° C. to 1,000° C. for about tens of minutes, whereby desired n-type diffusion layers are obtained.

Results of experiments relating to the particle formation with melting in a crucible having nozzles that were conducted by the present inventor will be described below.

Apparatus used for experiments: High-frequency heating apparatus, type name YKN-5 (manufactured by Nippon Koshuha Co., Ltd.)

High-frequency output power: 5 kW

Necessary electric power: 3-phase 200 V, 11 kVA

Oscillation frequency: about 400 kHz

Size: width 600 mm×height 1,170 mm×depth 700 mm

Weight: about 250 kg

Cooling method: air cooling

EXAMPLE 1

A silicon material of about 1.5 ml was put in a carbon crucible that has an outer diameter 20 mm, an external length 40 mm, and a capacity represented by an inner diameter 10 mm and a length 35 mm and that is accommodated in a ceramic air-tight and heat-insulative container having, at one end, a nozzle of 1 mm in internal diameter and 5 mm in length. Immediately before particle formation, high-frequency induction power of 4.6 kW was applied for about 20 minutes to stabilize particle forming conditions such as temperature. Particle formation was started with application of a nitrogen gas pressure of about 300 Pa, and silicon spheres having an average diameter of about 1 mm were produced. To decrease the degree of reaction between silicon and carbon as well as the degree of carbon burning due to presence of oxygen, a nitrogen gas pressure of about 100 Pa was maintained in a system in which the flow rate is made zero at the start of application of the high-frequency induction power to prevent a cooling phenomenon at that time. To decrease the degree of temperature reduction of the nozzle due to heat radiation, samples were taken after passage of a temperature holding section of about 10 mm in length.

EXAMPLE 2

A silicon material of about 1.5 ml was put in a carbon crucible that has an outer diameter 20 mm, an external length 40 mm, and a capacity represented by an inner diameter 10 mm and a length 30 mm and that is accommodated in a ceramic air-tight and heat-insulative container having, at one end, a nozzle of 1 mm in internal diameter and 10 mm in length. Immediately before particle formation, high-frequency induction power of 4.6 kW was applied for about 15 minutes to stabilize particle forming conditions such as temperature. Particle formation was started with application of a nitrogen gas pressure of about 500 Pa, and silicon spheres having an average diameter of about 1 mm were produced. To decrease the degree of reaction between silicon and carbon as well as the degree of carbon burning due to presence of oxygen, a nitrogen gas pressure of about 100 Pa was maintained in a system in which the flow rate is made zero at the start of application of the high-frequency induction power to prevent a cooling phenomenon at that time. To decrease the degree of temperature reduction of the nozzle due to heat radiation, samples were taken after passage of a temperature holding section of about 10 mm in length.

EXAMPLE 3

A silicon material of about 1.2 ml was put in a carbon crucible that has an outer diameter 20 mm, an external length 40 mm, and a capacity represented by an inner diameter 10 mm and a length 25 mm and that is accommodated in a ceramic air-tight and heat-insulative container having, at one end, a nozzle of 1 mm in internal diameter and 10 mm in length. Immediately before particle formation, high-frequency induction power of 3.6 kW was applied for about 20 minutes to stabilize particle forming conditions such as temperature. Particle formation was started with application of a nitrogen gas pressure of about 300 Pa, and silicon spheres having an average diameter of about 1 mm were produced. To decrease the degree of reaction between silicon and carbon as well as the degree of carbon burning due to presence of oxygen, a nitrogen gas pressure of about 100 Pa was maintained in a system in which the flow rate is made zero at the start of application of the high-frequency induction power to prevent a cooling phenomenon at that time. To decrease the degree of temperature reduction of the nozzle due to heat radiation, samples were taken after passage of a temperature holding section of about 20 mm in length. The reason why the high-frequency induction power applied was lower than in Example 2 is that the heat radiation was reduced by attaching a carbon cap for gas pressurization having a hole of 1 mm in inner diameter to the carbon crucible having an inner diameter 10 mm and a length 25 mm on the other side of the nozzle.

EXAMPLE 4

A silicon material of about 1.2 ml was put in a carbon crucible that has an outer diameter 20 mm, an external length 40 mm, and a capacity represented by an inner diameter 10 mm and a length 25 mm and that is accommodated in a ceramic air-tight and heat-insulative container having, at one end, a nozzle of 1 mm in internal diameter and 10 mm in length. Immediately before particle formation, high-frequency induction power of 3.6 kW was applied for about 20 minutes to stabilize particle forming conditions such as temperature. Particle formation was started with application of a nitrogen gas pressure of about 200 Pa, and silicon spheres having an average diameter of about 1 mm were produced. To decrease the degree of reaction between silicon and carbon as well as the degree of carbon burning due to presence of oxygen, a nitrogen gas pressure of about 100 Pa was maintained in a system in which the flow rate is made zero at the start of application of the high-frequency induction power to prevent a cooling phenomenon at that time. To decrease the degree of temperature reduction of the nozzle due to heat radiation, samples were taken after passage of a temperature holding section of about 20 mm in length. The reason why the nitrogen gas pressure was lower than in Example 3 is that vibration having a frequency of 30 Hz and a stroke of about 0.1 mm was applied in the nozzle ejection direction. The vibration is applied to obtain a sharper particle diameter profile. When vibration is applied under ejection conditions for a particle diameter of 1 mm, the diameter of output spheres becomes smaller than 1 mm.

Next, results of experiments relating to the melting crystallization that were conducted by the present inventor will be described.

Apparatus used for experiments: High-power, high-speed pulsed YAG laser welding machine, type number ML-2650A (manufactured by Miyachi Technos Co., Ltd.)

Maximum rated output power: 500 W

Maximum output energy: 70 J/pulse (pulse width: 10 m/s)

Pulse width: 0.5 ms to 30.0 ms (step: 0.1 ms)

Pulse repetition rate: 1 pps to 500 pps

Oscillation wavelength: 1.064 $\mu$m

EXAMPLE 5

An ore-crushed silicon material having a volume corresponding to a 1-mm-diameter sphere was held in a conical hole of a quartz plate. Laser light of 50 W was applied to the silicon material for 30 ms, whereby a crystalline silicon sphere of about 1 mm in diameter was obtained.

EXAMPLE 6

A spherical amorphous silicon material having a volume corresponding to a 1-mm-diameter sphere was held in a conical hole of a quartz plate. Laser light of 50 W was applied to the silicon material for 30 ms, whereby a crystalline silicon sphere of about 1 mm in diameter was obtained.

EXAMPLE 7

A spherical amorphous silicon material having a volume corresponding to a 1-mm-diameter sphere was held inside a quartz tube having an inner diameter of 2.5 mm. Laser light of 50 W was applied to the silicon material for 30 ms, whereby a crystalline silicon sphere of about 1 mm in diameter was obtained.

EXAMPLE 8

A spherical amorphous silicon material having a volume corresponding to a 1-mm-diameter sphere was held being stuck to a thin thread with an adhesive. Laser light of 36 W was applied to the silicon material for 10 ms, whereby a crystalline silicon sphere of about 1 mm in diameter was obtained.

Every laser light application was performed in such a manner that laser light is applied to a circular area having a diameter of about 0.6 mm and centered by a point corresponding to the center of gravity of an illumination target by using a monitor. Samples were taken after passage through a cooling cylinder.

In this specification, the term "pin junction" includes a structure that n, i and p-type semiconductor layers are formed on an approximately spherical photoelectric conversion element 2 so as to be arranged inward or outward in this order.

Spherical semiconductor particles manufactured according to the invention are photoelectric conversion elements 2.

The above-described photovoltaic apparatus 1 can be constructed by using photoelectric conversion elements 2 thus manufactured.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A photovoltaic apparatus comprising:

(a) a plurality of photoelectric conversion elements, each being of an approximately spherical shape and including a fir St semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and (b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portion of the first semiconductor layers.

2. The photovoltaic apparatus of claim 1, wherein the photoelectric conversion elements have an outer diameter of 0.5 mm to 2.0 mm.

3. The photovoltaic apparatus of claim 1, wherein the first semiconductor layer is a direct gap semiconductor layer.

4. A photovoltaic apparatus comprising:

(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and (b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portion of the first semiconductor layers, wherein the opening of the second semiconductor layer has a central angle θ1 of 45° to 90°.

5. A photovoltaic apparatus comprising:

(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and (b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portion of the first semiconductor layers, wherein the recesses of the support have respective openings of a polygon of which ones adjacent to each other are continuous, each of the recesses narrows toward a bottom thereof, and the first semiconductor layer and second semiconductor layer of each of the photoelectric conversion elements are electrically connected to the second conductor and the first conductor, respectively, at the bottom or in a vicinity thereof of the recess.

6. The photovoltaic apparatus of claim 5, wherein the first conductor is provided with a circular first connection hole formed at the bottom or in a vicinity thereof of the recess and the insulator is provided with a circular second connection hole having a common axial line with the first connection hole, a portion of the photoelectric conversion element in a vicinity of the opening of the second semiconductor layer fits in the first connection hole and an outer surface portion above the opening of the second semiconductor layer is electrically connected to an end face of the first connection hole of the first conductor or to a portion thereof in the vicinity of the end face, and the exposed portion of the first semiconductor layer of the photoelectric conversion element is electrically connected to the second conductor through the second connection hole.

7. The photovoltaic apparatus of claim 1, wherein an outer diameter D1 of the photoelectric conversion elements, an inner diameter D2 of the openings of the second semiconductor layers, and an inner diameter D3 of the first connection holes, and an inner diameter D4 of the second connection holes satisfy a relationship D1>D3>D2>4.

8. A photovoltaic apparatus comprising:
(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
(b) a support including a first conductor, a second conductor, and an insulator disposed between the first and second conductors for electrically insulting the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portion of the first semiconductor layers,
wherein a light-gathering ratio x which equals S1/S2 is selected to be in a range of 2 to 8, wherein S1 is an opening area of each of the recesses of the support and S2 is an area of a cross-section of the photoelectric conversion elements including a center thereof.

9. A photovoltaic apparatus comprising:
(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
(b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portions of the first semiconductor layers,
wherein each of the photoelectric conversion elements has an outer diameter of 0.5 mm to 2 mm, and a light-gathering ratio x which equals to S1/S2 is selected to be in a range of 2 to 8, wherein S1 is an opening area of each of the recesses of the support and S2 is an area of a cross-section of the photoelectric conversion elements including a center thereof.

10. A photovoltaic apparatus comprising:
(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
(b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portions of the first semiconductor layers,
wherein each of the photoelectric conversion elements has an outer diameter of 0.8 mm to 1.2 mm, and a light-gathering ratio x which equals to S1/S2 is selected to be in a range of 4 to 6, wherein S1 is an opening area of each of the recesses of the support and S2 is an area of a cross-section of the photoelectric conversion elements including a center thereof.

11. A photovoltaic apparatus comprising:
(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
(b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portion of the first semiconductor layers,
wherein the photovoltaic conversion elements each have a pn junction in such a manner that the second semiconductor layer of one conductivity type has a wider optical band gap than the first semiconductor layer having the other conductivity type and is formed outside the first semiconductor layer.

12. A photovoltaic apparatus comprising:
(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
(b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portion of the first semiconductor layers, wherein the photovoltaic conversion elements have a pin junction in such a manner that the first semiconductor layer having one conductivity type, an amorphous intrinsic semiconductor layer, and an amorphous second semiconductor layer of the other conductivity type having a wider optical band gap than the first semiconductor layer are arranged outward in this order.

13. The photovoltaic apparatus of claim 11, wherein the first semiconductor layer and the second semiconductor layer are made of n-type silicon and p-type amorphous SiC, respectively.

14. The photovoltaic apparatus of claim 13, wherein the n-type silicon of which the first semiconductor layer is made is n-type single-crystal silicon or n-type microcrystalline ($\mu$c) silicon.

15. A photovoltaic apparatus comprising:
(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
(b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portion of the first semiconductor layers, wherein the first semiconductor layer is a direct gap semiconductor layer, and wherein the direct gap semiconductor layer is made of a semiconductor selected from the group consisting of InAs, GaSb, CuInSe$_2$, Cu(InGa)Se$_2$, CuInS, GaAs, InGaP, and CdTe.

16. A photovoltaic apparatus comprising:
(a) a plurality of photoelectric conversion elements, each being of an approximately spherical shape and including a first semiconductor layer and a second semiconductor layer which is located outside the first semiconductor layer, for generating photoelectromotive force between the first and second semiconductor layers, the second semiconductor layer having an opening through which a portion of the first semiconductor layer is exposed; and
(b) a support including a first conductor, a second conductor, and an insulator disposed between the first and second conductors for electrically insulating the first and second conductors from each other, the support having a plurality of recesses which are arranged adjacent to each other and of which inside surfaces are constituted by the first conductor or a coating formed thereon, the photoelectric conversion elements being disposed in the respective recesses so that the photoelectric conversion elements are illuminated with light reflected by part of the first conductor or coating formed thereon which constitutes the recess, the first conductor being electrically connected to the second semiconductor layers of the photoelectric conversion elements, and the second conductor being electrically connected to the exposed portion of the first semiconductor layers, wherein a plurality of the supports each having peripheral portions extending outward are arranged adjacent to each other, and part of the first conductor in the peripheral portion of one support of each pair of supports adjacent to each other and part of the second conductor in the peripheral portion of the other support are laid one on another and electrically connected to each other.

17. The photovoltaic apparatus of claim 16, wherein the peripheral portion has upward projections or downward projections and the upward projection or downward projection of one support of each pair of supports adjacent to each other and the upward projection or downward projection of the other support are brought into contact with and electrically connected to each other.

* * * * *